(12) United States Patent
Takamine

(10) Patent No.: US 6,936,952 B2
(45) Date of Patent: Aug. 30, 2005

(54) SURFACE ACOUSTIC WAVE DEVICE AND COMMUNICATION DEVICE

(75) Inventor: Yuichi Takamine, Kanazawa (JP)

(73) Assignee: Murata Manufacturing, Co., LTD, Kyoto (JP)

( * ) Notice: Subject to any disclaimer, the term of this patent is extended or adjusted under 35 U.S.C. 154(b) by 21 days.

(21) Appl. No.: 10/665,107

(22) Filed: Sep. 19, 2003

(65) Prior Publication Data

US 2004/0080383 A1 Apr. 29, 2004

(30) Foreign Application Priority Data

Sep. 20, 2002 (JP) ...................................... 2002-274696

(51) Int. Cl.⁷ ............................................. H01L 41/08
(52) U.S. Cl. ................................. 310/313 D; 333/193
(58) Field of Search ........................ 310/313 R, 313 B, 310/313 C, 313 D; 333/193–196, 133

(56) References Cited

U.S. PATENT DOCUMENTS 6,081,172 A * 6/2000 Strauss et al. .............. 333/193
6,771,144 B2 * 8/2004 Takamine .................. 333/133
6,798,318 B1 * 9/2004 Abbott et al. ............... 333/195
6,815,868 B2 * 11/2004 Shibata et al. .......... 310/313 D

FOREIGN PATENT DOCUMENTS

JP      11-317642      11/1999

* cited by examiner

*Primary Examiner*—Mark Budd
(74) *Attorney, Agent, or Firm*—Keating & Bennett, LLP

(57) ABSTRACT

A surface acoustic wave device has a balanced-to-unbalanced conversion function, in which the common mode in the vicinity of outside the passband is satisfactory. The surface acoustic wave device includes surface acoustic wave filters having interdigital transducers (IDTs) arranged along a surface acoustic wave propagation direction, which filters are provided on a piezoelectric substrate so as to have a balanced-to-unbalanced conversion function, and balanced signal terminals are correspondingly connected to the surface acoustic wave filters. Surface acoustic wave resonators including an interdigital transducer sandwiched between reflectors are correspondingly connected in series to the balanced signal terminals. The center-to-center distance between mutually adjacent electrode fingers in the reflectors and the interdigital transducer in one of the surface acoustic wave resonators differs from that of the other surface acoustic wave resonator.

39 Claims, 27 Drawing Sheets

SURFACE ACOUSTIC WAVE DEVICE AND COMMUNICATION DEVICE

BACKGROUND OF THE INVENTION

1. Field of the Invention

The present invention relates to a surface acoustic wave device having a balanced-to-unbalanced conversion function and also relates to a communication device including such a surface acoustic wave device.

2. Description of the Related Art

Technological advances in smaller sized and lighter weight communication devices such as cellular phones in recent years have been remarkable. In order to achieve these advances, not only is the number of component parts reduced and each component part is miniaturized, but also parts in which a plurality of functions are combined have been increasingly developed.

In view of such circumstances, surface acoustic wave devices used in the RF stage of a cellular phone, to which a balanced-to-unbalanced conversion function, that is, a so-called balun function, is added, have been intensively researched in recent years, and have come to be mainly used in GSM (Global System for Mobile communications) apparatuses. Several patent applications for such surface acoustic wave devices having a balanced-to-unbalanced conversion function have been filed.

Recently, in surface acoustic wave devices having a balanced-to-unbalanced conversion function, there has been a demand for increasing not only the amount of attenuation of in-phase components (common mode) within the passband, but also those outside the passband.

For example, in a surface acoustic wave device having a balanced-to-unbalanced conversion function, there is one type in which a resonator is added between a balanced signal terminal and a surface acoustic wave filter, and furthermore, the cross width and the number of electrode fingers in the resonator are different (refer to, for example, Japanese Unexamined Patent Application Publication No. 11-317642).

However, in a surface acoustic wave device having a balanced-to-unbalanced conversion function using a longitudinally coupled resonator-type surface acoustic wave filter, there are problems in that the deterioration of the degree of balance due to the bridge capacity, etc., in particular, at higher frequencies of the passband, is severe, and the amount of common mode attenuation is small in this frequency band (or the common-mode signal level is large).

SUMMARY OF THE INVENTION

In order to overcome the problems described above, preferred embodiments of the present invention provide a surface acoustic wave device that is capable of increasing the amount of common mode attenuation at higher frequencies of the passband.

According to a preferred embodiment of the present invention, a surface acoustic wave device includes at least one surface acoustic wave filter having at least two interdigital transducers arranged along a surface acoustic wave propagation direction, the at least one surface acoustic wave filter being arranged on a piezoelectric substrate so as to have a balanced-to-unbalanced conversion function and two balanced signal terminals being connected to the surface acoustic wave filter, and surface acoustic wave resonators including an interdigital transducer sandwiched between reflectors are correspondingly connected in series to the two balanced signal terminals, wherein a center-to-center distance between mutually adjacent electrode fingers in the reflector and the interdigital transducer in one of the surface acoustic wave resonators differs from that of the other surface acoustic wave resonator.

In the surface acoustic wave device, when the wavelength determined by the structure of the interdigital transducer of the surface acoustic wave filter is denoted as $\lambda$, and when the center-to-center distances between mutually adjacent electrode fingers in the reflector and the interdigital transducer in the two surface acoustic wave resonators are correspondingly denoted as $X\lambda$ and $Y\lambda$, preferably, the following relationship is satisfied:

$$(0+0.5n)\lambda < |X-Y|\lambda \leq (0.18+0.5n)\lambda$$

where n=0, 1, 2 . . .

According to the above-described unique configuration, a surface acoustic wave resonator is connected in series between each surface acoustic wave filter and the balanced signal terminal, and in each surface acoustic wave resonator, the center-to-center distances between the outermost electrode fingers in the interdigital transducer and the reflector differ from each other. Therefore, the amplitude and phase characteristics in one of the surface acoustic wave resonators differ from those of the other surface acoustic wave resonator, making it possible to correct the deviation of the degree of balance at higher frequencies of the passband in each surface acoustic wave filter. Therefore, a surface acoustic wave device in which the amount of common mode attenuation at higher frequencies of the passband is large is obtained.

According to another preferred embodiment of the present invention, a surface acoustic wave device includes at least one surface acoustic wave filter having at least two interdigital transducers arranged along a surface acoustic wave propagation direction, the at least one surface acoustic wave filter being arranged on a piezoelectric substrate so as to have a balanced-to-unbalanced conversion function and two balanced signal terminals being connected to the surface acoustic wave filter, and surface acoustic wave resonators including an interdigital transducer sandwiched between reflectors are correspondingly connected in series to the two balanced signal terminals, wherein a ratio of the pitch of the reflector to the pitch of the interdigital transducer in one of the surface acoustic wave resonators differs from that of the other surface acoustic wave resonator.

In such a surface acoustic wave device, when the ratio of the pitch of the reflector to the pitch of the interdigital transducer (the pitch of the interdigital transducer/the pitch of the reflector) in the two surface acoustic wave resonators are correspondingly denoted as a and b, the following relationship is preferably satisfied:

$$0.984 \leq a/b < 1.$$

According to the above-described unique configuration, a surface acoustic wave resonator is connected in series between each surface acoustic wave filter and the balanced signal terminal, and in each surface acoustic wave resonator, the ratio of the pitch of the reflector differs from the pitch of the interdigital transducer. Therefore, the amplitude and phase characteristics in one of the surface acoustic wave resonators differ from those of the other surface acoustic wave resonator, making it possible to correct the deviation of the degree of balance at higher frequencies of the passband in each surface acoustic wave filter. Therefore, a surface acoustic wave device in which the amount of common mode attenuation at higher frequencies of the passband is large is obtained.

According to another preferred embodiment of the present invention, a surface acoustic wave device includes at least one surface acoustic wave filter having at least two interdigital transducers arranged along a surface acoustic wave propagation direction, the at least one surface acoustic wave filter being arranged on a piezoelectric substrate so as to have a balanced-to-unbalanced conversion function and two balanced signal terminals being connected to the surface acoustic wave filter, and surface acoustic wave resonators including an interdigital transducer sandwiched between reflectors are correspondingly connected in series to the two balanced signal terminals, wherein the duty in the interdigital transducer and/or the reflector in one of the surface acoustic wave resonator differs from that of the other surface acoustic wave resonator.

In the surface acoustic wave device, when the duties in the interdigital transducer and/or the reflector in the two surface acoustic wave resonators are correspondingly denoted as x and y, preferably, the following relationship is satisfied:

$$0<|x-y|\leq 0.05.$$

According to the above-described unique configuration, a surface acoustic wave resonator is connected in series between each surface acoustic wave filter and the balanced signal terminal, and in each surface acoustic wave resonator, the duty in the reflector differs from the duty in the interdigital transducer. Therefore, the amplitude and phase characteristics in one of the surface acoustic wave resonators differ from those of the other surface acoustic wave resonator, making it possible to correct the deviation of the degree of balance at higher frequencies of the passband in each surface acoustic wave filter. Therefore, a surface acoustic wave device in which the amount of common mode attenuation at higher frequencies of the passband is large is obtained.

According to another preferred embodiment of the present invention, a surface acoustic wave device includes at least one surface acoustic wave filter having at least two interdigital transducers arranged along a surface acoustic wave propagation direction, the at least one surface acoustic wave filter being arranged on a piezoelectric substrate so as to have a balanced-to-unbalanced conversion function and two balanced signal terminals being connected to the surface acoustic wave filter, and surface acoustic wave resonators including an interdigital transducer sandwiched between reflectors are correspondingly connected in series to the two balanced signal terminals, wherein at least two of the center-to-center distance between mutually adjacent electrode fingers in the reflector and the interdigital transducer, the ratio of the pitch of the reflector to the pitch of the interdigital transducer, and the duty in the interdigital transducer and/or reflector in one of the surface acoustic wave resonator differ from those of the other surface acoustic wave resonator.

According to the above-described configuration, surface acoustic wave resonators including an interdigital transducer sandwiched between reflectors are correspondingly connected in series to the two balanced signal terminals, and any two or more of the center-to-center distance between mutually adjacent electrode fingers in the reflector and the interdigital transducer, the ratio of the pitch of the reflector to the pitch of the interdigital transducer, and the duty in the interdigital transducer and/or the reflector in each surface acoustic wave resonator are different. Therefore, the amplitude and phase characteristics in one of the surface acoustic wave resonators differ from those of the other surface acoustic wave resonator, making it possible to correct the deviation of the degree of balance at higher frequencies of the passband in each surface acoustic wave filter. Therefore, a surface acoustic wave device in which the amount of common mode attenuation at higher frequencies of the passband is large is obtained.

In one preferred embodiment, the surface acoustic wave device includes two longitudinally coupled resonator-type surface acoustic wave filters having three or five interdigital transducers.

In another preferred embodiment, the surface acoustic wave device includes one longitudinally coupled resonator-type surface acoustic wave filter having three or five interdigital transducers.

In the surface acoustic wave device, at least one of the interdigital transducers of the longitudinally coupled resonator-type surface acoustic wave filter may be divided in a surface acoustic wave propagation direction. Furthermore, in the surface acoustic wave device, at least one of the interdigital transducers of the longitudinally coupled resonator-type surface acoustic wave filter may be divided in a surface acoustic wave cross-width direction.

In the surface acoustic wave device according to various preferred embodiments of the present invention, the piezoelectric substrate may be housed in a package by using a face-down mounting technique.

According to yet another preferred embodiment of the present invention, a communication device includes one of the above-described surface acoustic wave devices. According to such a configuration, since the communication device has a surface acoustic wave device in which the amount of attenuation at lower frequencies of the passband is large and the amount of common mode attenuation is also large, it is possible to provide a communication device in which the amount of attenuation at lower frequencies of the passband is large and the amount of common mode attenuation is also large.

Other features, elements, characteristics and advantages of the present invention will become more apparent from the following detailed description of preferred embodiments thereof with reference to the attached drawings.

DETAILED DESCRIPTION OF PREFERRED EMBODIMENTS

First Preferred Embodiment

A preferred embodiment of the present invention will now be described below with reference to FIGS. 1 to 15. In this preferred embodiment, a description will be provided by using as an example a surface acoustic wave device for DCS (digital communication system) reception.

Figure 1:
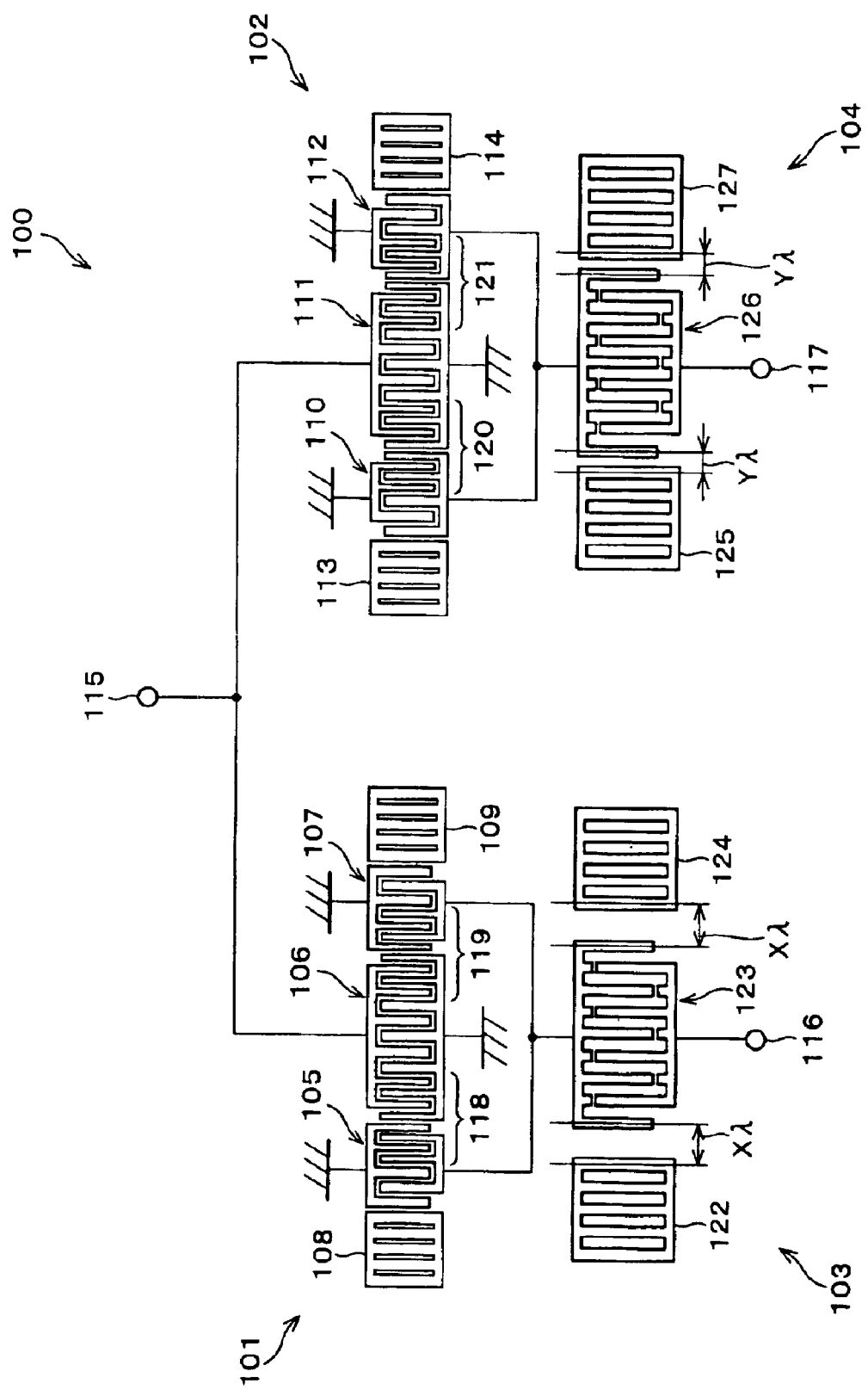
FIG. 1 is a schematic view of a surface acoustic wave device according to a first preferred embodiment of the present invention.

FIG. 1 shows the configuration of the essential portion of a surface acoustic wave device 100 according to this preferred embodiment. The surface acoustic wave device 100 includes two longitudinally coupled resonator-type surface acoustic wave filters 101 and 102, and surface acoustic wave resonators 103 and 104 connected in series to the longitudinally coupled resonator-type surface acoustic wave filters 101 and 102, respectively, which are provided on a piezoelectric substrate (not shown). The longitudinally coupled resonator-type surface acoustic wave filters 101 and 102 and the surface acoustic wave resonators 103 and 104 are preferably formed by Al electrodes. In this preferred embodiment, the piezoelectric substrate is preferably a 40±5° Y-cut X-propagation LiTaO3 substrate. The surface acoustic wave device 100 has a balanced-to-unbalanced conversion function by using the longitudinally coupled resonator-type surface acoustic wave filters 101 and 102. Here, in the surface acoustic wave device 100, an example is used in which the impedance of the unbalanced signal terminal is about 50Ω and the impedance of the balanced signal terminal is about 150Ω.

The longitudinally coupled resonator-type surface acoustic wave filter 101 is configured such that interdigital transducers (hereinafter referred to as "IDTs") 105 and 107 are arranged so as to sandwich an IDT 106 having a plurality of electrode fingers and reflectors 108 and 109 are disposed on both sides thereof. As shown in FIG. 1, several electrode fingers between the mutually adjacent IDT 105 and IDT 106 and between the mutually adjacent IDT 106 and IDT 107 have a pitch smaller than that of the other portions of the IDTs (narrow pitch electrode-finger sections 118 and 119).

The longitudinally coupled resonator-type surface acoustic wave filter 102 is configured in such a manner that IDTs 110 and 112 are arranged so as to sandwich an IDT 111 and reflectors 113 and 114 are disposed on both sides thereof. Similarly to the longitudinally coupled resonator-type surface acoustic wave filter 101, narrow pitch electrode-finger sections 120 and 121 are provided between the IDT 110 and the IDT 111 and between the IDT 111 and the IDT 112, respectively. The orientation of the IDT 110 and the IDT 112 of the longitudinally coupled resonator-type surface acoustic wave filter 102 is reversed in the cross-width direction with respect to the IDT 105 and the IDT 107 of the longitudinally coupled resonator-type surface acoustic wave filter 101. As a result, the phase of the output signal with respect to the input signal in the longitudinally coupled resonator-type surface acoustic wave filter 102 is inverted by approximately 180° with respect to that of the longitudinally coupled resonator-type surface acoustic wave filter 101.

Furthermore, in this preferred embodiment, the IDTs 106 and 111 of the longitudinally coupled resonator-type surface acoustic wave filters 101 and 102 are connected to an unbalanced signal terminal 115. Furthermore, the IDTs 105 and 107, and the IDTs 110 and 112 of the longitudinally coupled resonator-type surface acoustic wave filters 101 and 102 are connected to balanced signal terminals 116 and 117, respectively.

The surface acoustic wave resonators 103 and 104 are configured the same in such a manner that reflectors 122 and 124 are arranged so as to sandwich an IDT 123 and reflectors 125 and 127 are arranged so as to sandwich an IDT 126.

Figure 2:
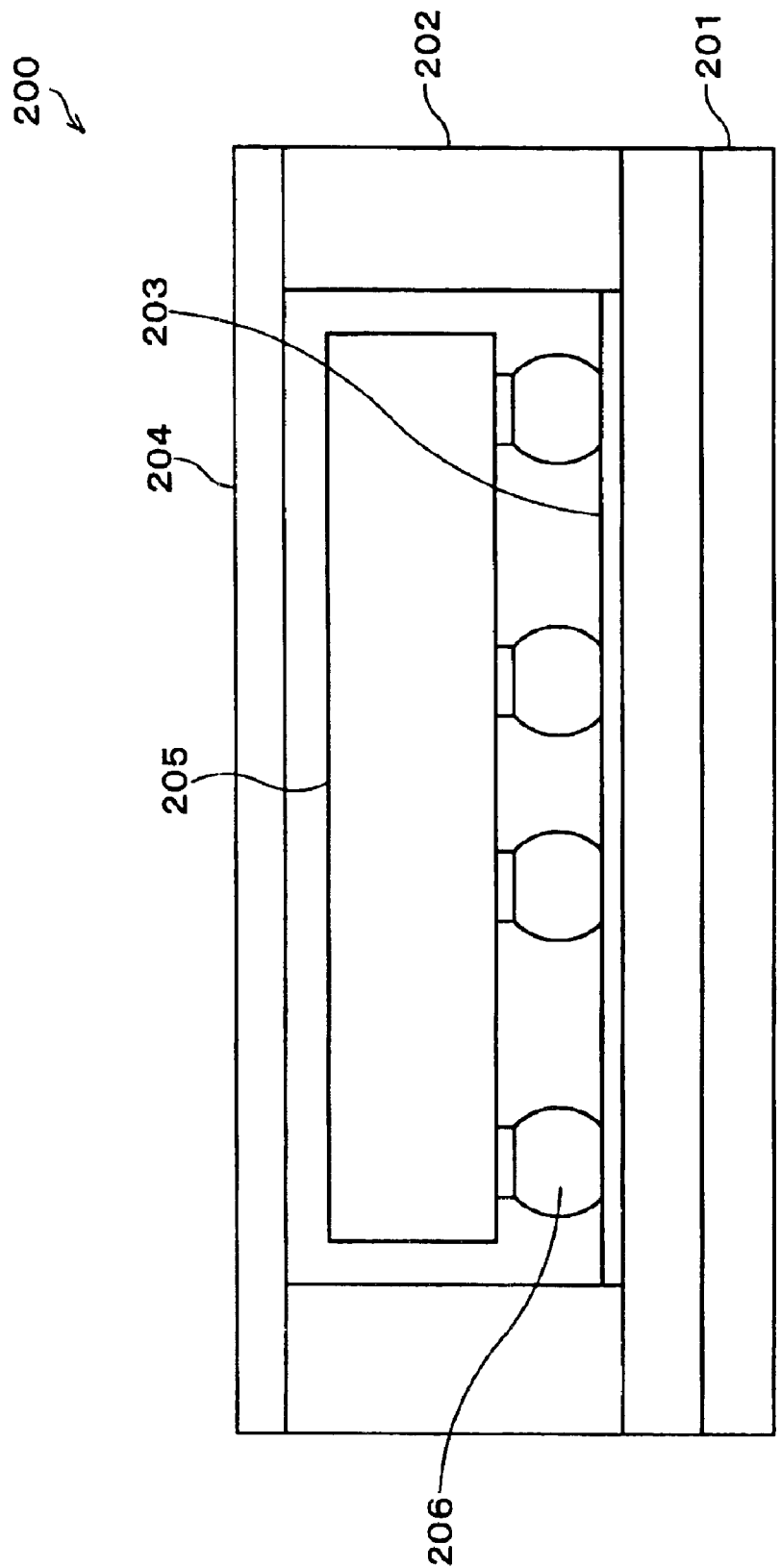
FIG. 2 is a sectional view of the essential portion of the surface acoustic wave device of the first preferred embodiment, which is housed in a package.

A sectional view of the surface acoustic wave device housed in a package in this preferred embodiment is shown in FIG. 2. The surface acoustic wave device is manufactured by a flip-chip technique in which the conduction between the package and a piezoelectric substrate 205 is made by a bump bonding 206.

The package preferably has a two-layer structure, and includes a bottom-plate portion 201, a side wall portion 202, a die-attach portion 203, and a cap 204. This bottom-plate portion 201 preferably has, for example, a substantially rectangular shape, and the side-wall portions 202 are arranged in a standing manner at the four corresponding peripheral portions of this bottom-plate portion 201. The cap 204 covers and seals the opening formed by the side-wall portions 202. On the top surface (inner surface) of this bottom plate portion 201, the die-attach portion 203 for making conduction with the piezoelectric substrate 205 is formed. The piezoelectric substrate 205 and the die-attach portion 203 are coupled by the bump 206.

In the longitudinally coupled resonator-type surface acoustic wave device 100 according to the first preferred embodiment of the present invention, the distance $X\lambda$ between the centers of mutually adjacent electrode fingers of each of the reflectors 122 and 124 and the IDT 123 in the surface acoustic wave resonator 103 differs from the distance $Y\lambda$ between the centers of mutually adjacent electrode fingers of each of the reflectors 125 and 127 and the IDT 126 in the surface acoustic wave resonator 104. That is, the distance between the centers of the outermost electrode fingers of the IDTs and the reflectors differs between the surface acoustic wave resonators 103 and 104. The symbol $\lambda$ is a wavelength determined by the electrode-finger pitch in the IDT of the surface acoustic wave filter. For example, in the surface acoustic wave resonator 103, $X\lambda=0.57\lambda$, and in the surface acoustic wave resonator 104, $Y\lambda=0.43\lambda$.

A detailed example of the design of the longitudinally coupled resonator-type surface acoustic wave filters 101 and 102 according to the first preferred embodiment of the present invention is described below.

If the wavelength determined by the pitch of the electrode fingers in which the pitch of the electrode fingers is not made narrow is denoted as $\lambda1$:

the cross width: about $41.8\lambda1$;

the number of IDTs: (in the order of the IDT 105, the IDT 106, and the IDT 107): 18(3)/(3)33(3)/(3)18 (the numerals within the parentheses indicate the number of electrode fingers in which the pitch is made narrow);

the number of reflectors: 60 (the reflectors 108 and 109), and 90 (the reflectors 113 and 114);

the duty: about 0.72 (IDT), about 0.57 (reflector); and the thickness of the electrode film: about $0.092\lambda1$.

A detailed example of the design of the surface acoustic wave reflectors 103 and 104 is described below.

the cross width: about $16.5\lambda1$;

the number of IDTs: 180;

the number of reflectors: 15;

the duty: about 0.60; and the thickness of the electrode film: about $0.093\lambda1$.

Figure 5:
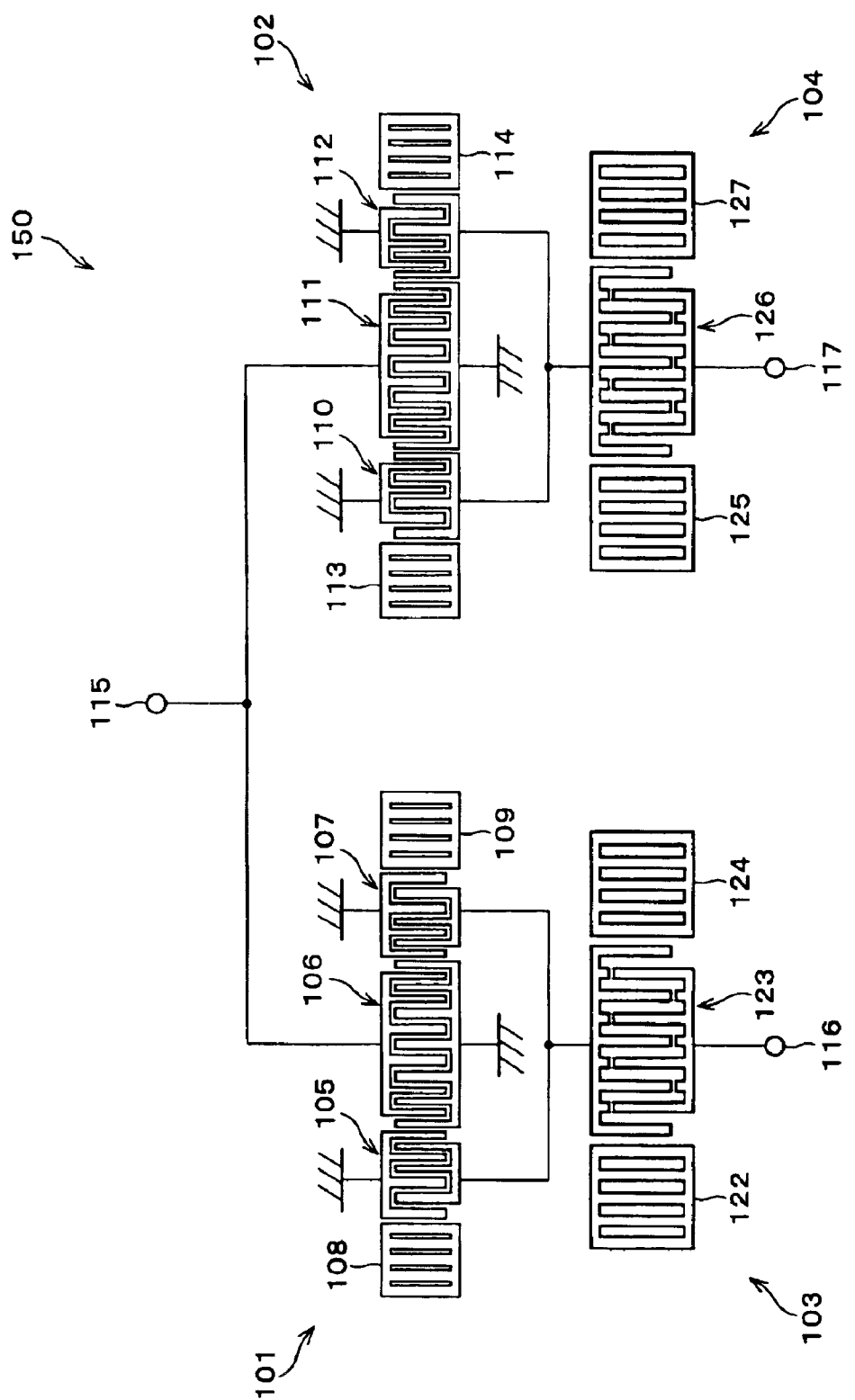
FIG. 5 is a schematic view of the surface acoustic wave device of comparative example 1.

For the comparison with respect to the surface acoustic wave device 100 according to the first preferred embodiment, the configuration of a surface acoustic wave device 150 of comparative example 1 is shown in FIG. 5. This surface acoustic wave device 150 is configured in such a manner that, when compared to the surface acoustic wave device 100, the distance $X\lambda$ between the centers of mutually adjacent electrode fingers of each of the reflectors 122 and 124 and the IDT 123 in the surface acoustic wave resonator 103 is set at about $0.50\lambda$, and the distance $Y\lambda$ between the centers of mutually adjacent electrode fingers of each of the reflectors 125 and 127 and the IDT 126 in the surface acoustic wave resonator 104 is set at about $0.50\lambda$. The other design parameters are preferably the same as those of the surface acoustic wave device 100.

Figure 3:
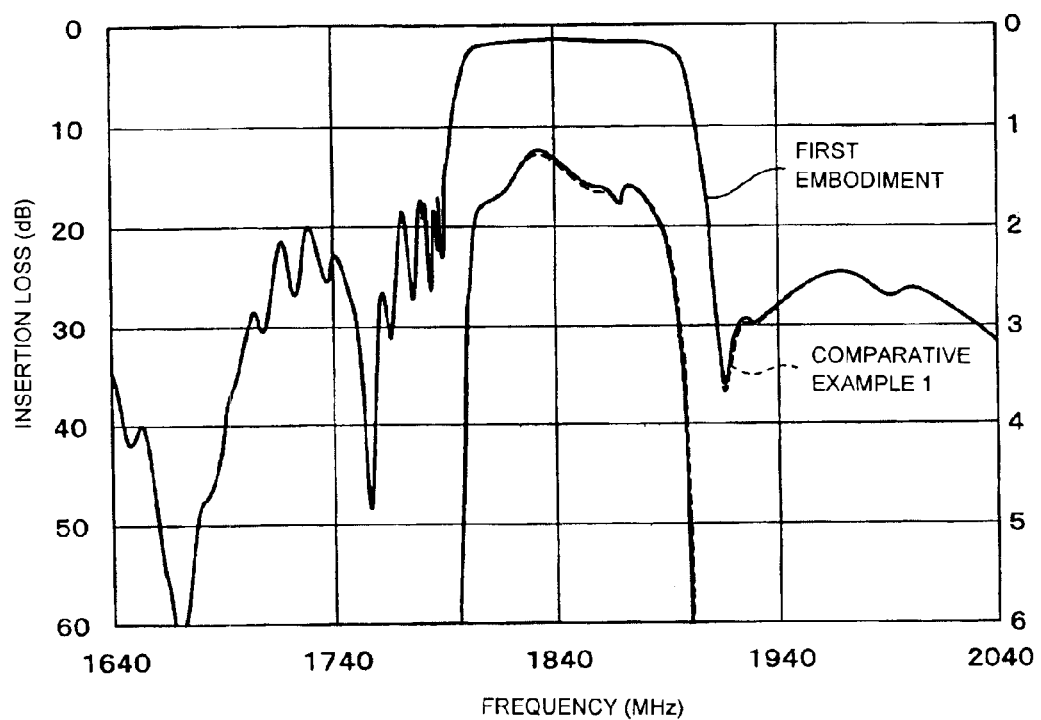
FIG. 3 is a graph showing the surface acoustic wave frequency versus transmission characteristics in the surface acoustic wave device of the first preferred embodiment and in a surface acoustic wave device of comparative example 1.
Figure 4:
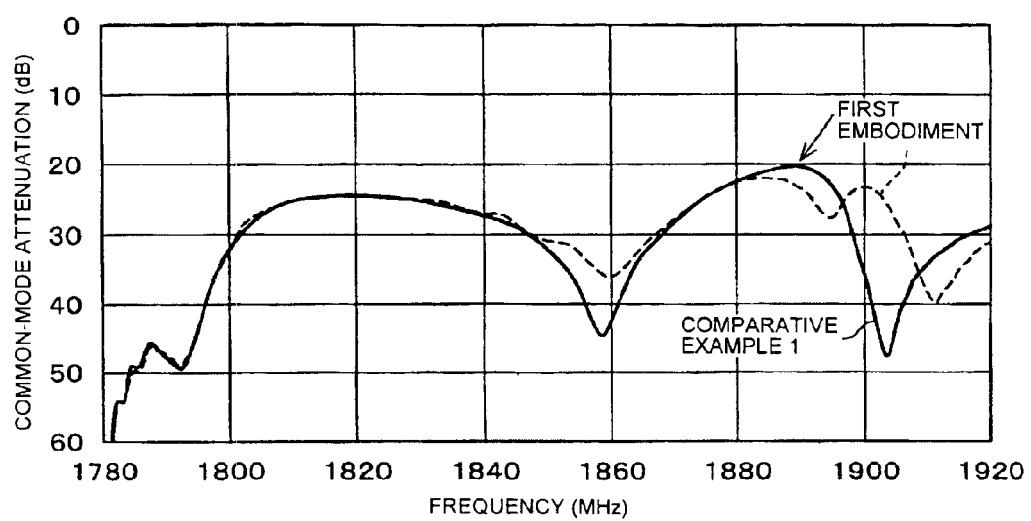
FIG. 4 is a graph showing the frequency versus common mode attenuation characteristics in the surface acoustic wave device of the first preferred embodiment and in the surface acoustic wave device of comparative example 1.

FIGS. 3 and 4 show the frequency versus insertion loss characteristics (the frequency versus insertion loss characteristics), and the frequency versus common-mode attenuation characteristics in the surface acoustic wave device 100 of the first preferred embodiment. FIGS. 3 and 4 also show the frequency versus transmission characteristics, and the frequency versus VSWR (Voltage Standing Wave Ratio) characteristics in the surface acoustic wave device 150 of comparative example 1.

When FIG. 4 is viewed, in the surface acoustic wave device 100 according to the first preferred embodiment, the common-mode attenuation in the vicinity of 1880 MHz to 1900 MHz is approximately 22 dB, whereas in the surface acoustic wave device 150 of comparative example 1, the common-mode attenuation is approximately 20 dB. That is, it can be seen that this common-mode attenuation is improved by approximately 2 dB. At this time, a large deterioration of the common-mode attenuation is not seen. Furthermore, as can be seen by viewing FIG. 4, a deterioration of insertion loss within the passband is also not seen. This is due to the effect that, since the distance $X\lambda$ between the centers of mutually adjacent electrode fingers of each of the reflectors 122 and 124 and the IDT 123 in the surface acoustic wave resonator 103 differs from the distance $Y\lambda$ between the centers of mutually adjacent electrode fingers of each of the reflectors 125 and 127 and the IDT 126 in the surface acoustic wave resonator 104, the amplitude and phase characteristics in the surface acoustic wave resonator 103 differ from those in the surface acoustic wave resonator 104, and the deviation of the degree of balance at higher frequencies of the passband in the longitudinally coupled resonator-type surface acoustic wave filters 101 and 102 is corrected.

Figure 6:
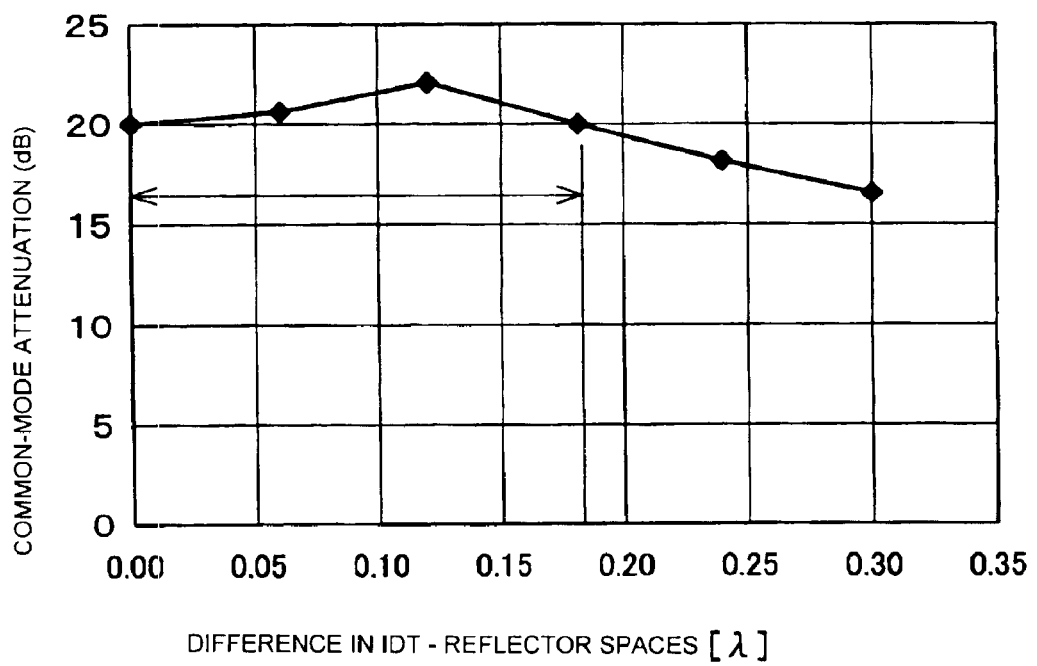
FIG. 6 is a graph in which the range in which the advantages of the surface acoustic wave device of the first preferred embodiment are obtained was checked.

Next, the range in which the common-mode attenuation is improved was studied. The study was made in such a manner that the center-to-center distance $X\lambda$ between mutually adjacent electrode fingers of each of the reflectors 122 and 124 and the IDT 123 in the surface acoustic wave resonator 103, and the distance $Y\lambda$ between the centers of mutually adjacent electrode fingers of each of the reflectors 125 and 127 and the IDT 126 in the surface acoustic wave resonator 104 were changed, and the common-mode attenuation at 1880 MHz to 1900 MHz with respect to the difference therebetween was checked. The results are shown in FIG. 6. It can be seen from FIG. 6 that, until the difference between $X\lambda$ and $Y\lambda$ is about $0.18\lambda$, common-mode attenuation which is larger than that in a case where $X\lambda$ and $Y\lambda$ are not made different (made identical) is obtained. That is, it can be seen that, in the surface acoustic wave device 100, preferably, $(0+0.5n)\lambda<|X-Y|\lambda\leq(0.18+0.5n)\lambda$, where n=0, 1, 2 . . .

As described above, in the first preferred embodiment, in the surface acoustic wave device having a balanced-to-unbalanced conversion function by using two longitudinally coupled resonator-type surface acoustic wave filters in which surface acoustic wave resonators are connected in series, the surface acoustic wave resonators are correspondingly connected in series between the longitudinally coupled resonator-type surface acoustic wave filters and the balanced signal terminal, and the center-to-center distance between the outermost electrode fingers of the IDT and the reflector in each of the surface acoustic wave resonators is made different. As a result, a surface acoustic wave device having a large common-mode attenuation at higher frequencies of the passband is obtained.

Figure 7:
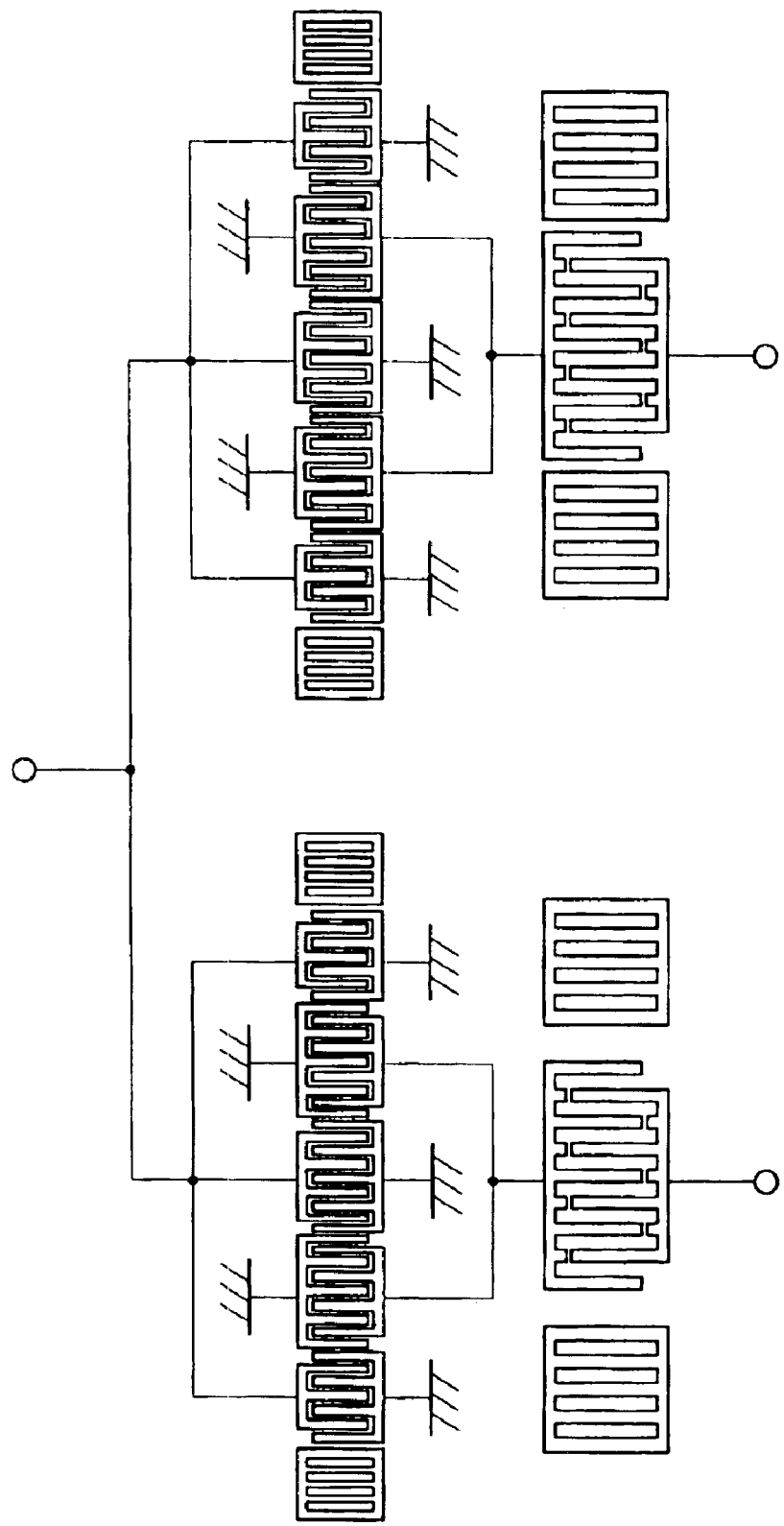
FIG. 7 is a schematic view showing a modification of the surface acoustic wave device.

Although in the first preferred embodiment, an example is described in which two longitudinally coupled resonator-type surface acoustic wave filters having three IDTs are used, two longitudinally coupled resonator-type surface acoustic wave filters having five IDTs may be used, as shown in FIG. 7.

Figure 8:
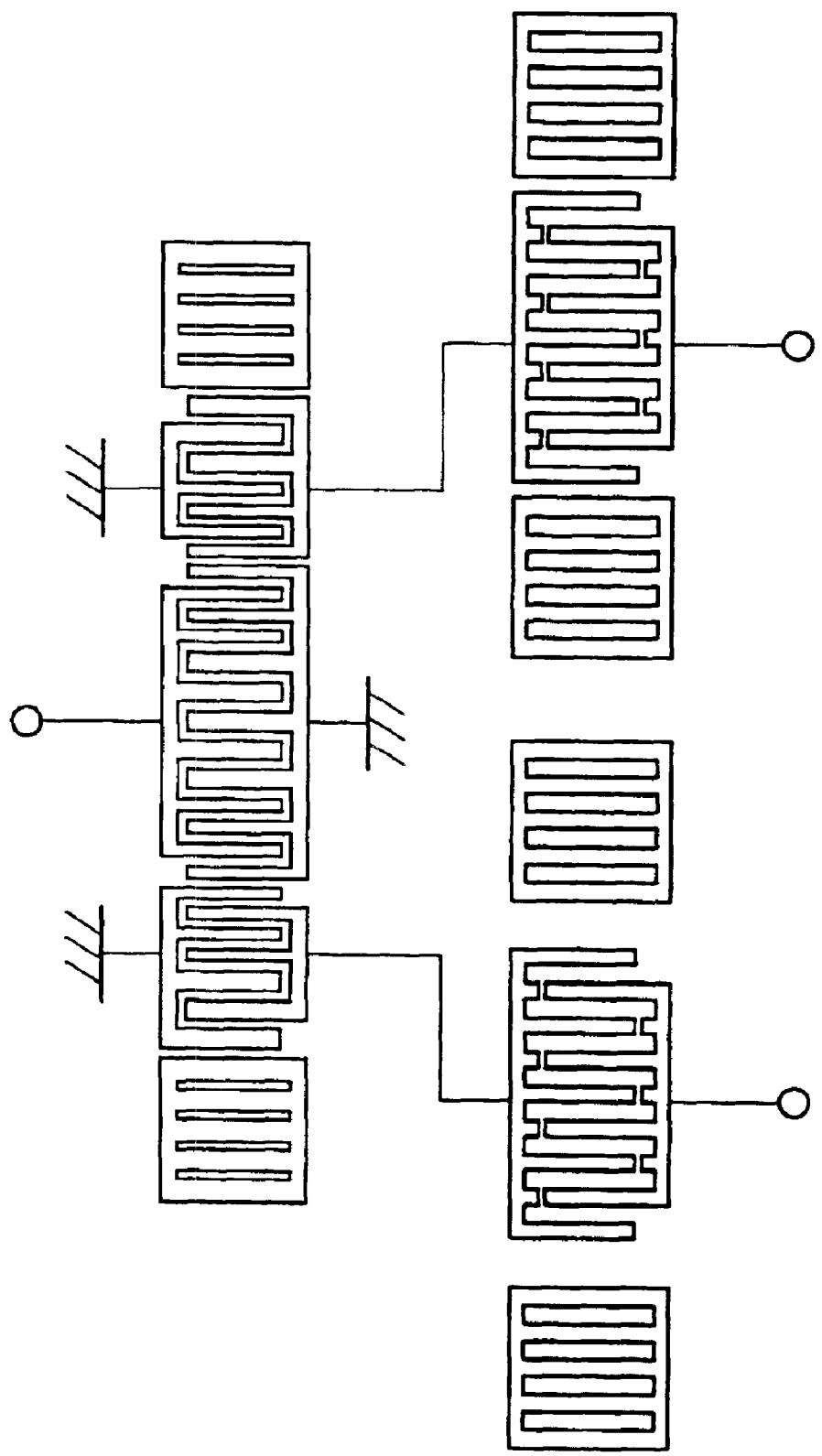
FIG. 8 is a schematic view showing another modification of the surface acoustic wave device.
Figure 9:
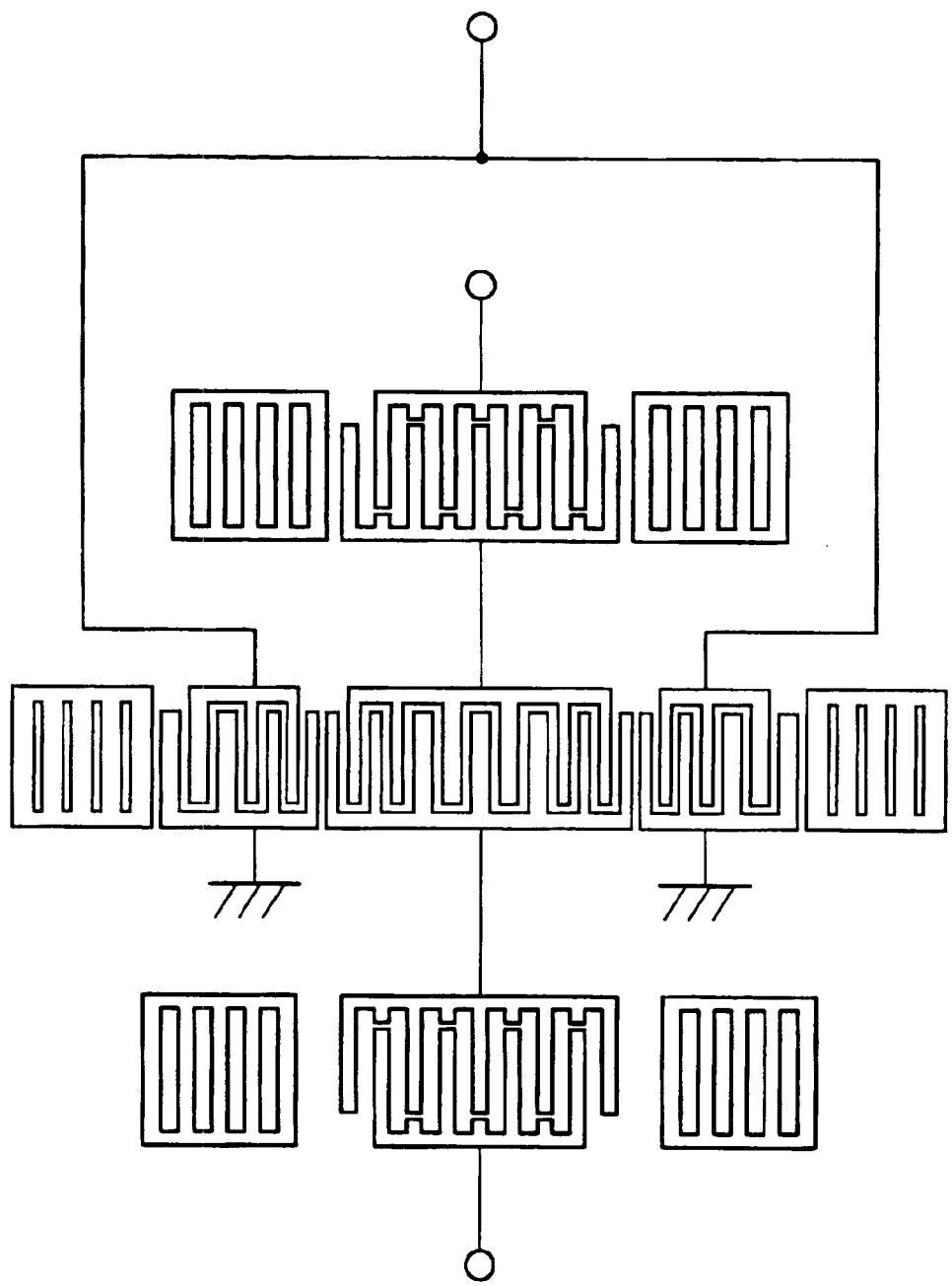
FIG. 9 is a schematic view showing another modification of the surface acoustic wave device.
Figure 10:
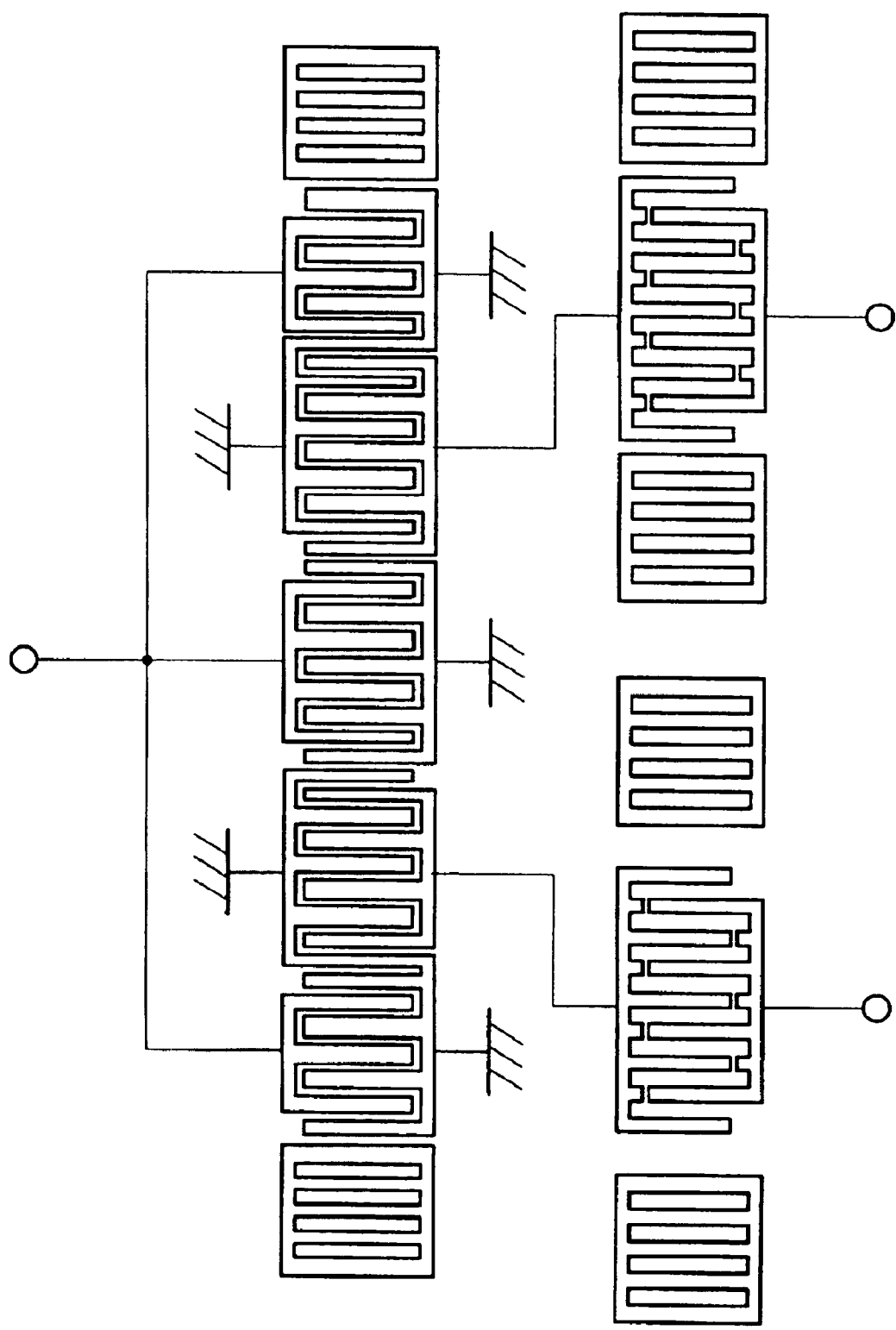
FIG. 10 is a schematic view showing another modification of the surface acoustic wave device.
Figure 11:
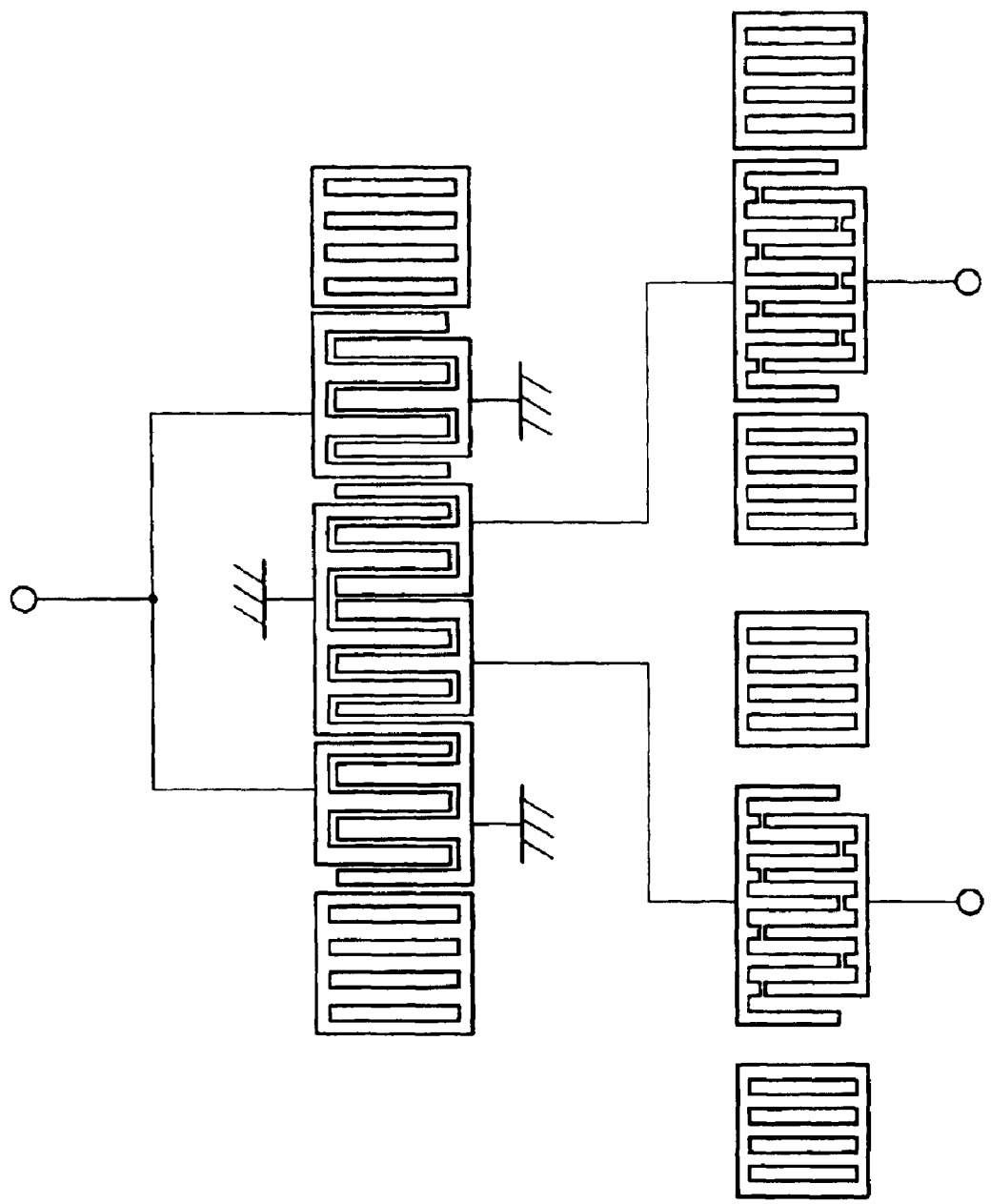
FIG. 11 is a schematic view showing another modification of the surface acoustic wave device.
Figure 12:
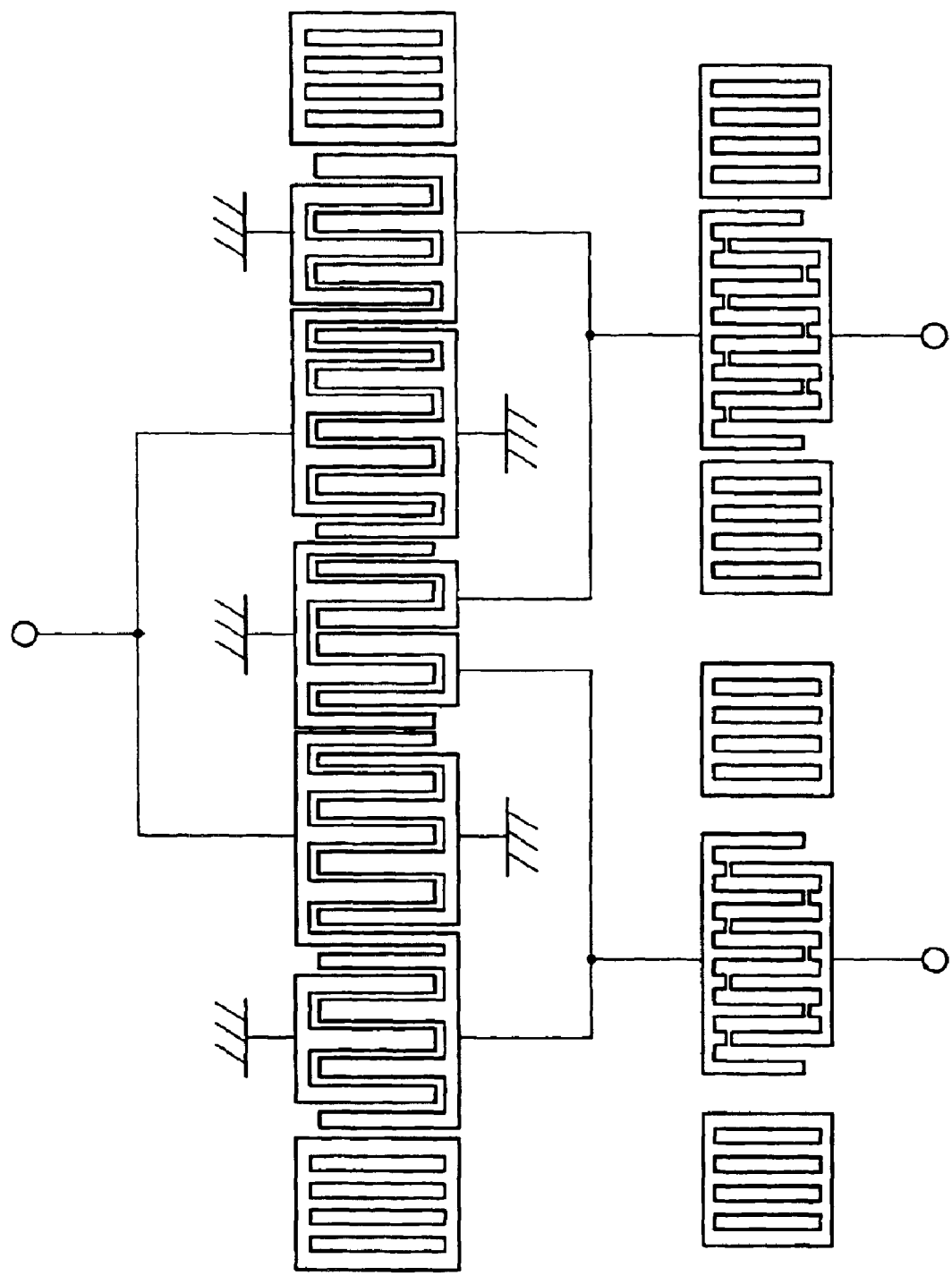
FIG. 12 is a schematic view showing another modification of the surface acoustic wave device.
Figure 13:
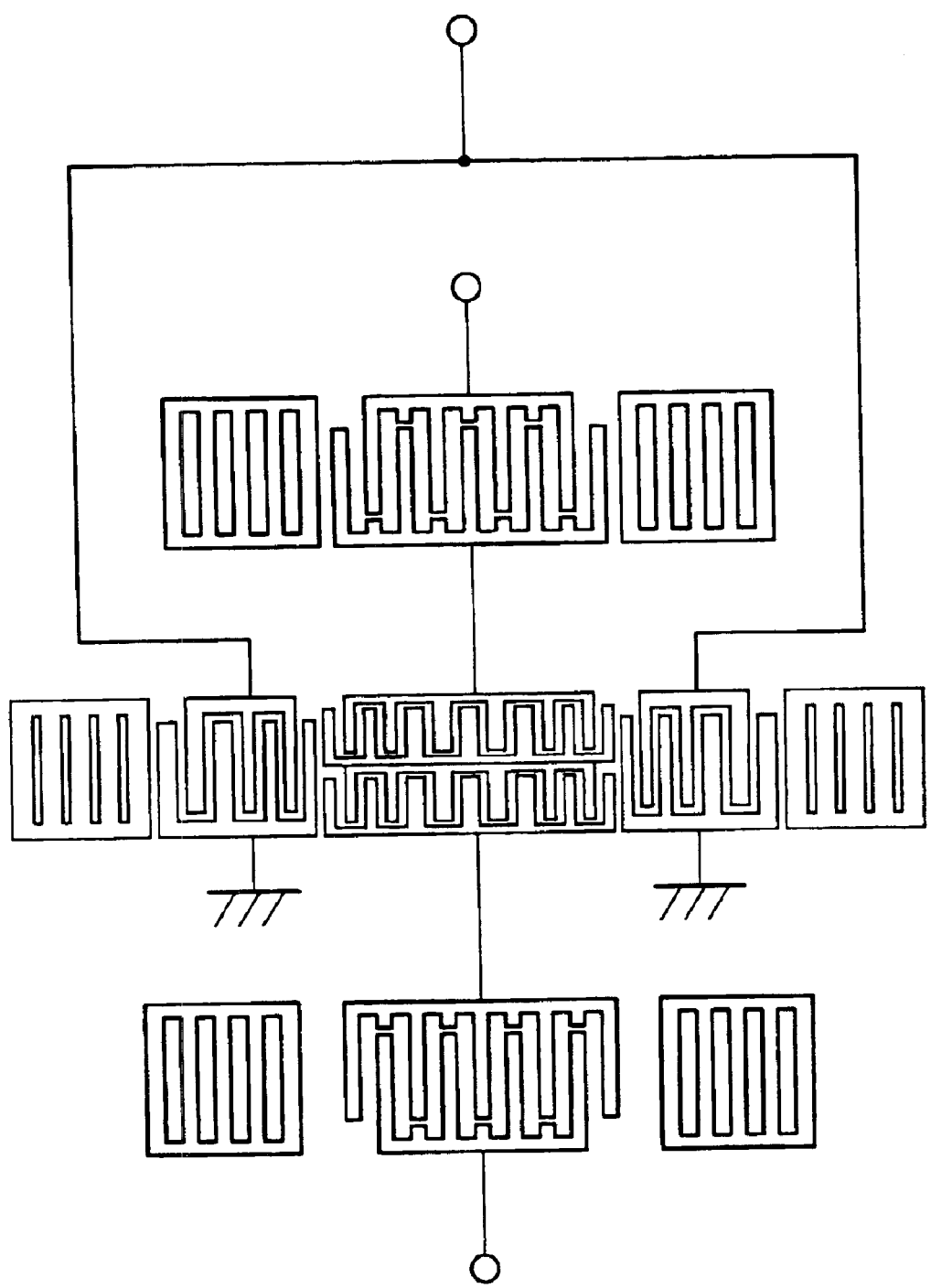
FIG. 13 is a schematic view showing another modification of the surface acoustic wave device.

As shown in FIGS. 8 to 10, a surface acoustic wave device having a balanced-to-unbalanced conversion function may include one longitudinally coupled resonator-type surface acoustic wave filter. Furthermore, as shown in FIGS. 11 to 13, a surface acoustic wave device having a balanced-to-unbalanced conversion function may include a surface acoustic wave filter in which at least one IDT is divided in a surface acoustic wave propagation direction or in a cross-width direction.

In the configurations of FIGS. 7 to 13, a surface acoustic wave device having a large common-mode attenuation at higher frequencies of the passband is obtained by making the distances between the centers of the outermost electrode fingers of the IDTs and the reflectors different in each surface acoustic wave resonator.

In the first preferred embodiment, as shown in FIG. 2, a surface acoustic wave device is manufactured by a method of making conduction between the package 200 and each electrode pad on the piezoelectric substrate 205 by a face-down mounting technique using a bump-bonding technique. However, instead of using the face-down mounting technique, a wire-bonding technique may be used.

Figure 14:
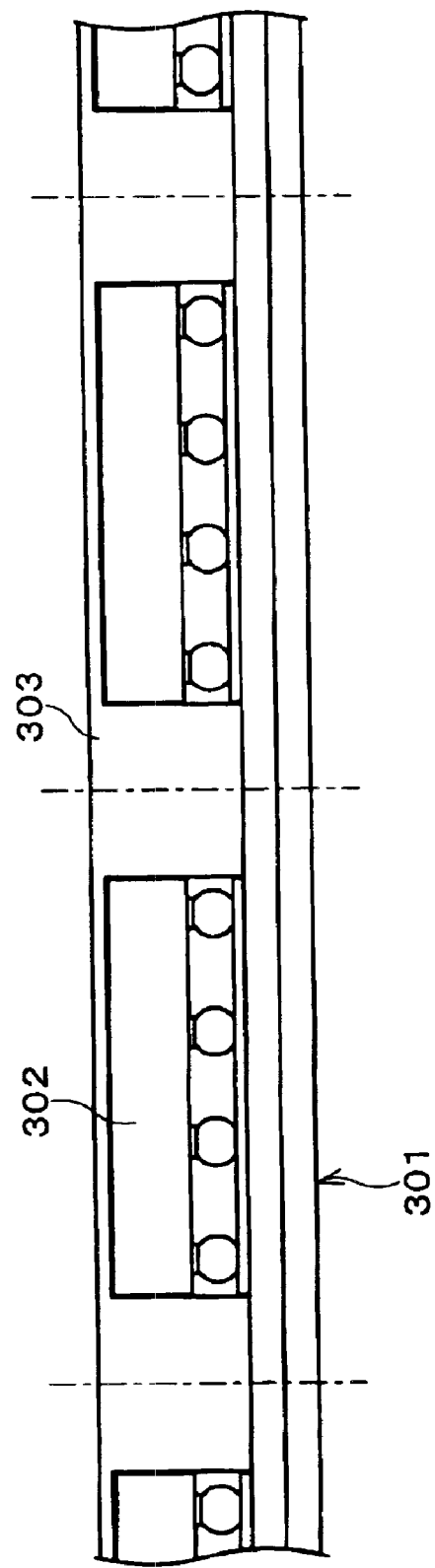
FIG. 14 is a sectional view showing a manufacturing process of the surface acoustic wave device of a preferred embodiment of the present invention.
Figure 15:
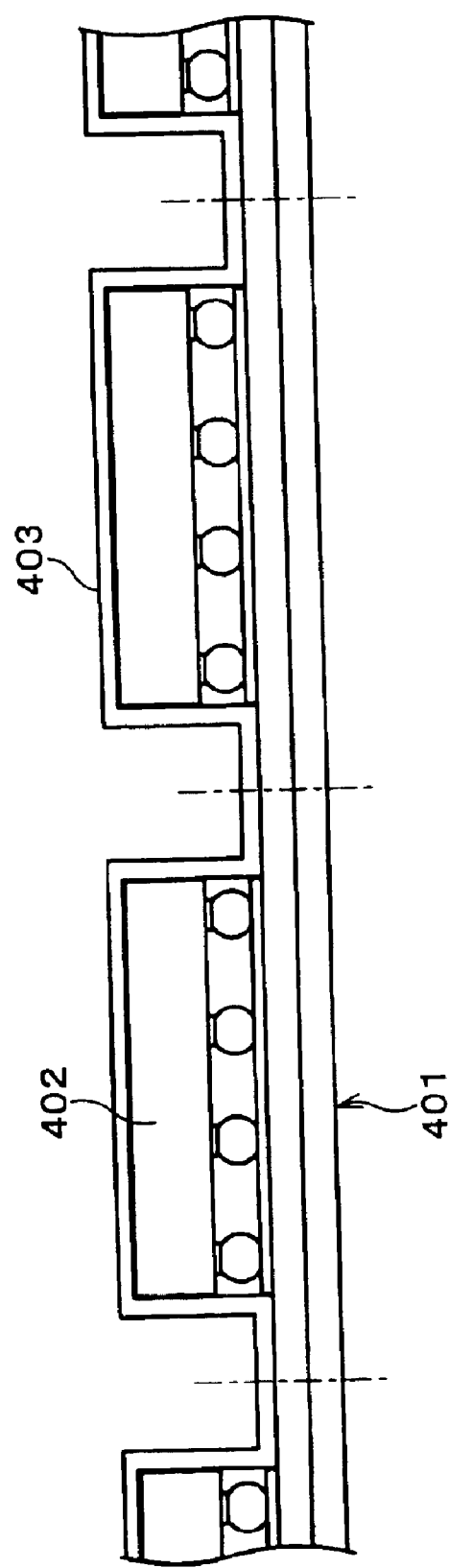
FIG. 15 is a sectional view showing another manufacturing process of the surface acoustic wave device of a preferred embodiment of the present invention.
Figure 16:
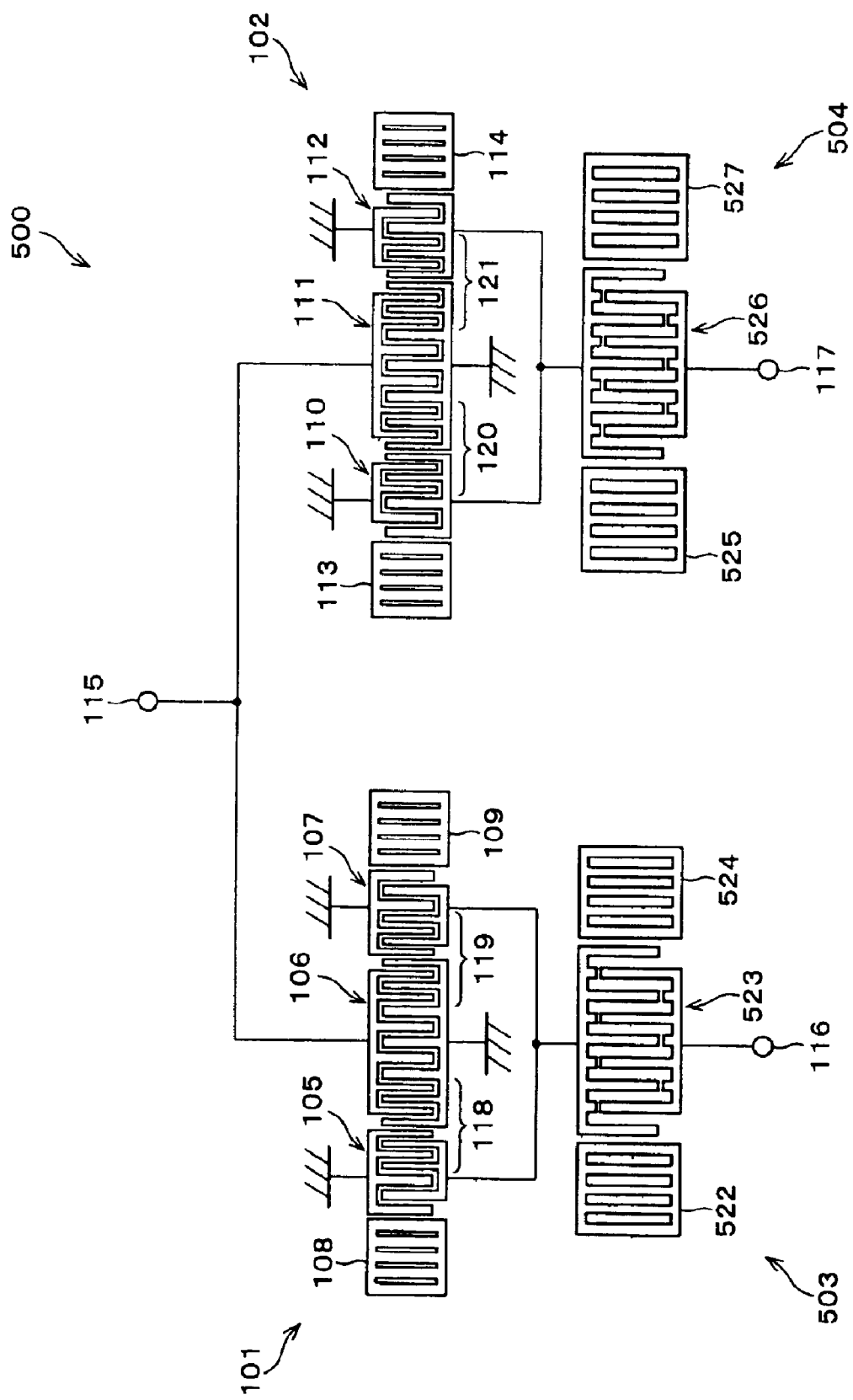
FIG. 16 is a schematic view of a surface acoustic wave device according to a second preferred embodiment of the present invention.

For the configuration in which the surface acoustic wave device is manufactured by a face-down mounting technique, in addition to the configuration of FIG. 5, the surface acoustic wave device may be manufactured by a configuration in which, for example, as shown in FIG. 14, a piezoelectric substrate 302 is bonded onto a clustered substrate 301 by using a flip-chip technique, this is sealed by covering with a resin 303, and this is cut into individual packages by dicing, or may be manufactured by a configuration in which, as shown in FIG. 15, similarly, a piezoelectric substrate 402 is bonded onto a clustered substrate 401 by using a flip-chip technique, this is sealed by covering with a resin 403, and this is cut into individual packages by dicing.

Although in the first preferred embodiment, a piezoelectric substrate formed from 40±5° Y-cut X-propagation LiTaO3 is preferably used, in the present invention, as can be understood from the principles from which the advantages are obtained, in addition to this piezoelectric substrate, the same advantages can be obtained with a piezoelectric substrate, such as, for example, 64° to 72° Y-cut X-propagation LiNbO3 or 41° Y-cut X-propagation LiNbO3.

Second Preferred Embodiment

Another preferred embodiment of the present invention will now be described below with reference to FIGS. 16 to 19. For the sake of convenience of description, components having the same function as that of the components shown in the first preferred embodiment are designated with the same reference numerals, and accordingly, descriptions thereof are omitted.

A surface acoustic wave device 500 according to the second preferred embodiment is configured in such a manner that, when compared to the surface acoustic wave device 100 of the first preferred embodiment, the surface acoustic wave resonators 103 and 104 are replaced with surface acoustic wave resonators 503 and 504. The surface acoustic wave resonators 503 and 504 are configured in such a manner that reflectors 522 and 525, and reflectors 524 and 527 are arranged so as to sandwich IDTs 523 and 526, respectively. In the surface acoustic wave resonators 503 and 504, the ratio "a" of the pitch of the IDT 523 to the pitch of the reflectors 522 and 524 in the surface acoustic wave resonator 503 differs from the ratio "b" of the pitch of the IDT 526 to the pitch of the reflectors 525 and 527 in the surface acoustic wave resonator 504. The pitch ratio is represented as "the IDT pitch/the reflector pitch". The pitch ratios of the IDT and to the reflector in the surface acoustic wave resonators 503 and 504 are preferably set as a=0.994 and b=1.006, respectively. The other design parameters in the surface acoustic wave device 500 are preferably identical to those of the surface acoustic wave device 150 of comparative example 1 described above.

Figure 17:
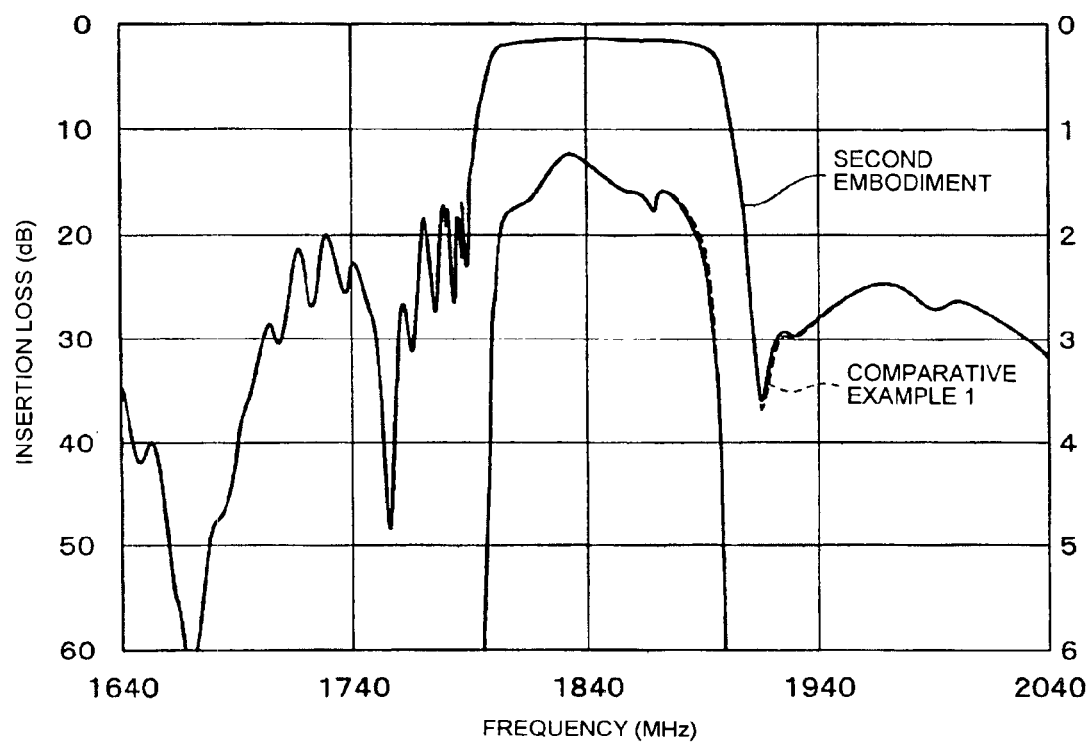
FIG. 17 is a graph showing the surface acoustic wave frequency versus transmission characteristics in the surface acoustic wave device of the second preferred embodiment and in a surface acoustic wave device of comparative example 1.
Figure 18:
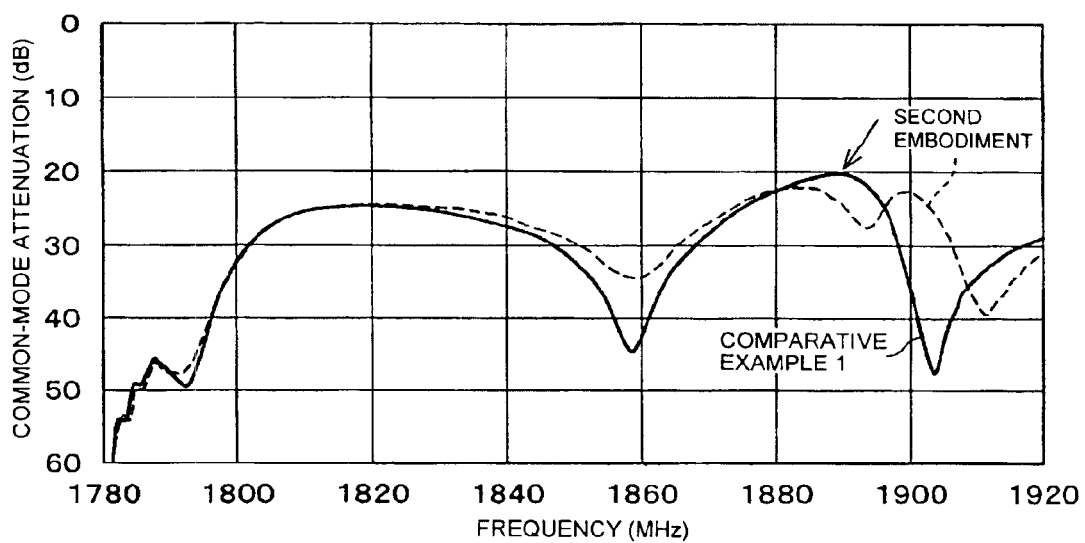
FIG. 18 is a graph showing the frequency versus common mode attenuation characteristics in the surface acoustic wave device of the second preferred embodiment and in the surface acoustic wave device of comparative example 1.

FIGS. 17 and 18 show the frequency versus transmission characteristics (the frequency versus insertion loss characteristics), and the frequency versus common-mode attenuation characteristics, respectively, in the surface acoustic wave device 500 according to the second preferred embodiment. FIGS. 17 and 18 also show the frequency versus transmission characteristics, and the frequency versus VSWR characteristics in the surface acoustic wave device 150 of comparative example 1.

When FIG. 18 is viewed, in the surface acoustic wave device 500 according to the second preferred embodiment, the common-mode attenuation in the vicinity of 1880 MHz to 1900 MHz is approximately 20 dB, whereas in the surface acoustic wave device 150 of comparative example 1, the common-mode attenuation is approximately 22 dB. That is, it can be seen that this common-mode attenuation is improved by approximately 2 dB. At this time, a large deterioration of the common-mode attenuation within the passband is not seen. Furthermore, as can be seen by viewing FIG. 17, a deterioration of insertion loss within the passband is also not seen. This is due to the effect that, since the ratio of the pitch of the IDT to the pitch of the reflector are made different in the surface acoustic wave device 503 and the surface acoustic wave device 504, the amplitude and phase characteristics in the surface acoustic wave device 503 differ from those of the surface acoustic wave device 504, and the deviation of the degree of balance at higher frequencies of the passband in the longitudinally coupled resonator-type surface acoustic wave filters 101 and 102 is corrected.

Figure 19:
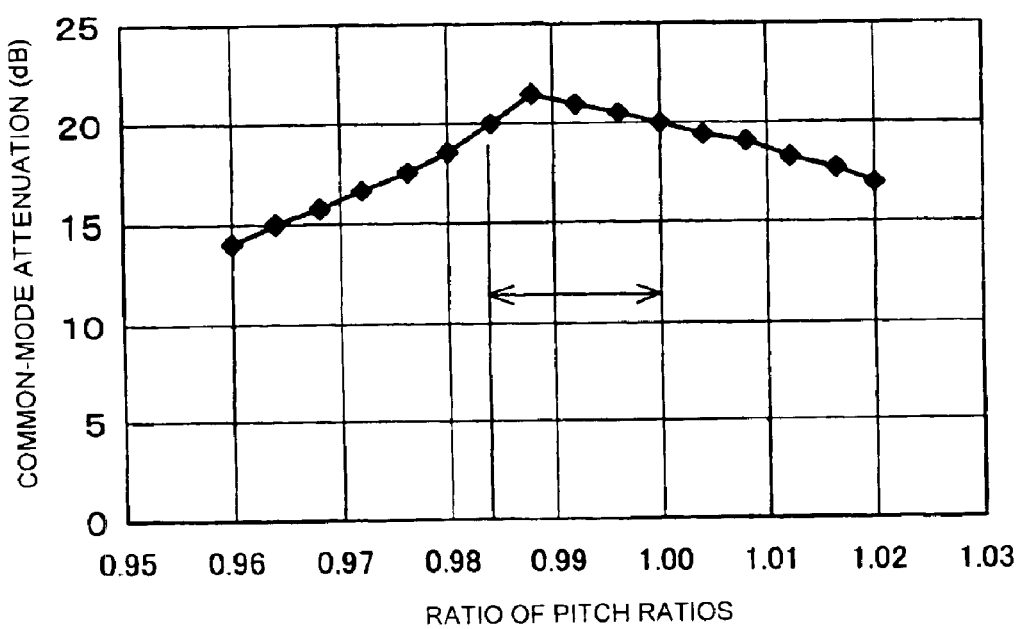
FIG. 19 is a graph in which the range in which the advantages of the surface acoustic wave device of the second preferred embodiment are obtained was checked.
Figure 20:
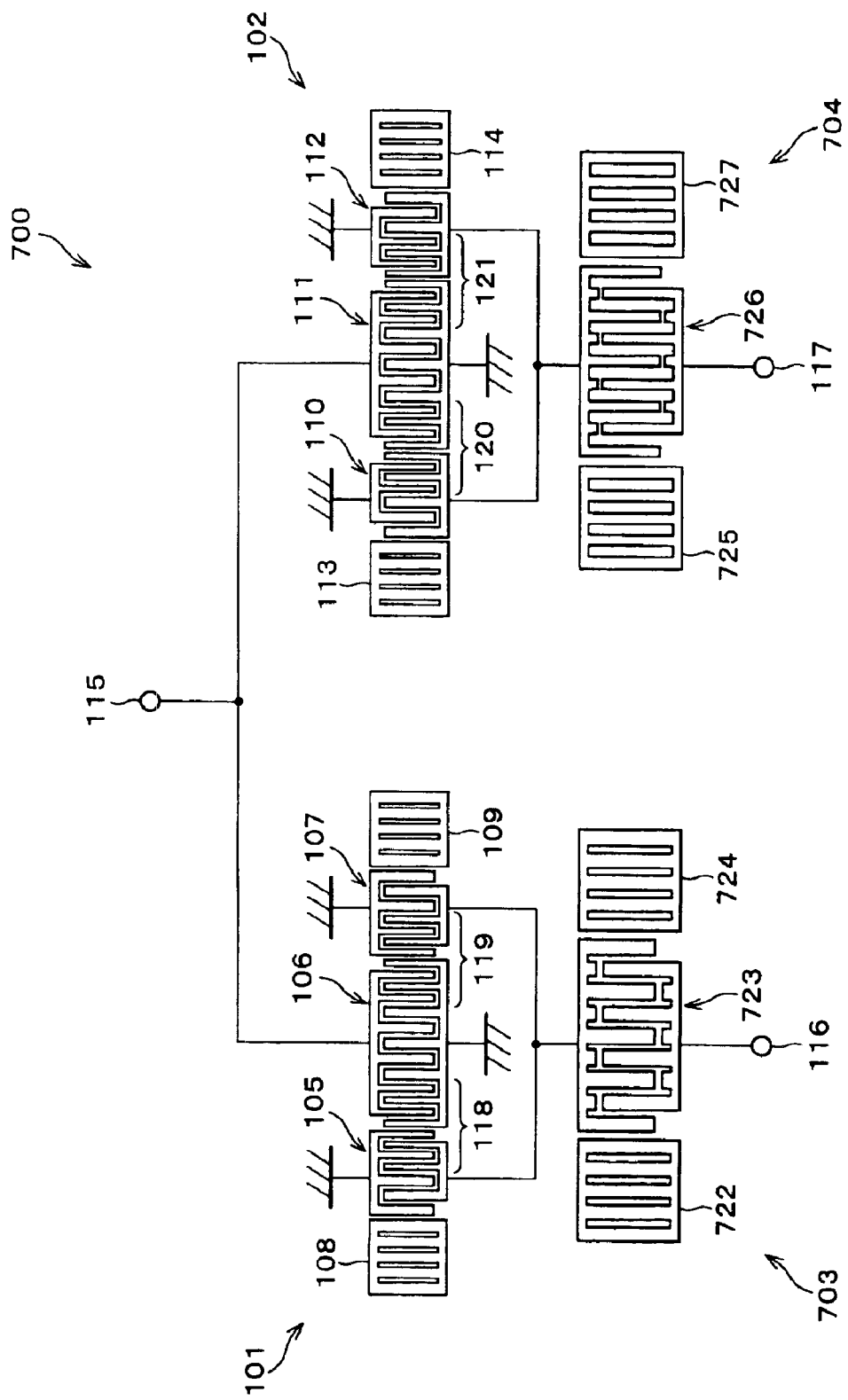
FIG. 20 is a schematic view of a surface acoustic wave device according to a third preferred embodiment of the present invention.

Next, the range in which the common-mode attenuation is improved was studied. The study was made in such a manner that the ratio (a) of the pitch of the IDT 523 to the pitch of the reflectors 522 and 524 in the surface acoustic wave resonator 503 and the ratio (b) of the pitch of the IDT 526 to the pitch of the reflectors 524 and 527 in the surface acoustic wave resonator 504 were changed, and the common-mode attenuation at 1880 MHz to 1900 MHz with respect to the ratio of the pitch ratios (the pitch ratio (a/b) of the surface acoustic wave resonator 503/the pitch ratio of the surface acoustic wave resonator 504) was checked. The results are shown in FIG. 19. It can be seen from FIG. 19 that, until the ratio of the pitch ratios is approximately 0.984, common-mode attenuation which is larger than that in a case where the pitch ratio is not made different is obtained. That is, in the surface acoustic wave device 500, it can be seen that, preferably, the ratio of the pitch ratios is in the approximate range of $0.984 \leq a/b < 1$.

As described in the foregoing, in the second preferred embodiment, in the surface acoustic wave device having a balanced-to-unbalanced conversion function by using two longitudinally coupled resonator-type surface acoustic wave filters in which surface acoustic wave resonators are connected in series, the surface acoustic wave resonators are correspondingly connected in series between the longitudinally coupled resonator-type surface acoustic wave filters and the balanced signal terminal, and the ratio of the pitch of the IDT to the pitch of the reflectors in each surface acoustic wave resonator is made different. As a result, it is possible to obtain a surface acoustic wave device having a large common-mode attenuation at higher frequencies of the passband.

In the surface acoustic wave device 500 of the second preferred embodiment, although an example in which two longitudinally coupled resonator-type surface acoustic wave filters having three IDTs are used is described, the surface acoustic wave device may be configured to use two longitudinally coupled resonator-type surface acoustic wave filters having five IDTs. Furthermore, the surface acoustic wave device having a balanced-to-unbalanced conversion function may be configured by using one longitudinally coupled resonator-type surface acoustic wave filter. Furthermore, a surface acoustic wave device having a balanced-to-unbalanced conversion function may be configured by using a surface acoustic wave filter in which at least one IDT is divided in the surface acoustic wave propagation direction or in the cross-width direction. In the above-described configuration, by differentiating the ratio of the pitch of the IDT and the pitch of the reflector in each surface acoustic wave resonator, a surface acoustic wave device having a large common-mode attenuation at higher frequencies of the passband can be obtained.

Third Preferred Embodiment

Another preferred embodiment of the present invention will now be described below with reference to FIGS. 20 to 25. For the sake of convenience of description, components having the same function as that of the components shown in the first preferred embodiment are designated with the same reference numerals, and accordingly, descriptions thereof are omitted.

A surface acoustic wave device 700 according to the third preferred embodiment is configured in such a manner that, when compared to the surface acoustic wave device 100 of the first preferred embodiment, the surface acoustic wave resonators 103 and 104 are replaced with surface acoustic wave resonators 703 and 704. The surface acoustic wave resonators 703 and 704 are configured in such a manner that reflectors 722 and 725, and reflectors 724 and 727 are arranged so as to sandwich IDTs 723 and 726, respectively. In the surface acoustic wave resonators 703 and 704, the duties of the IDT 723 and the reflectors 722 and 724 in the surface acoustic wave resonator 703 differ from the duties of the IDT 726 and the reflectors 725 and 727 in the surface acoustic wave resonator 704. The duties in the surface acoustic wave resonators 703 and 704 are preferably about 0.620 and about 0.580, respectively. The other design parameters in the surface acoustic wave device 700 are preferably the same as those of the surface acoustic wave device 150 in comparative example 1 described above.

Figure 21:
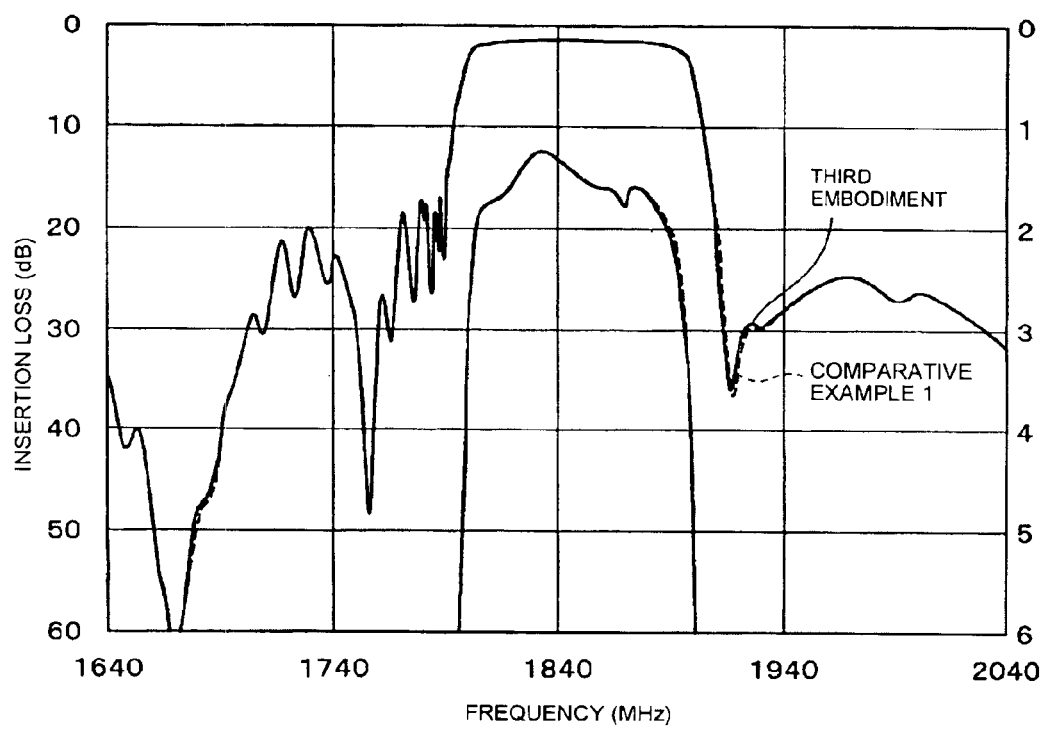
FIG. 21 is a graph showing the acoustic wave frequency versus transmission characteristics in the surface acoustic wave device of the third preferred embodiment and in the surface acoustic wave device of comparative example 1.
Figure 22:
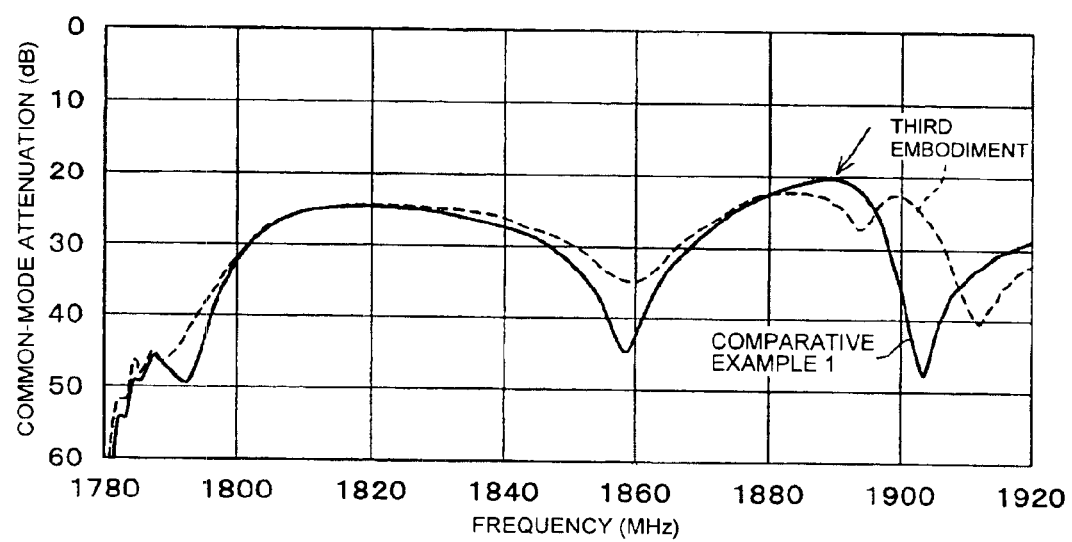
FIG. 22 is a graph showing the frequency versus common mode attenuation characteristics in the surface acoustic wave device of the third preferred embodiment and in the surface acoustic wave device of comparative example 1.

FIGS. 21 and 22 show the frequency versus transmission characteristics (the frequency versus insertion loss characteristics), and the frequency versus common-mode attenuation characteristics, respectively, in the surface acoustic wave device 700 of the third preferred embodiment.

FIGS. 21 and 22 also show the frequency versus transmission characteristics, and the frequency versus VSWR characteristics, respectively, in the surface acoustic wave device 150 of comparative example 1.

When FIG. 22 is viewed, in the surface acoustic wave device 700 of the third preferred embodiment, the common-mode attenuation in the vicinity of 1880 MHz to 1900 MHz is approximately 20 dB, whereas in the surface acoustic wave device 150 of comparative example 1, the common-mode attenuation is approximately 22 dB. That is, it can be seen that this common-mode attenuation is improved by approximately 2 dB. At this time, a large deterioration of the common-mode attenuation within the passband is not seen. Furthermore, as can be seen by viewing FIG. 21, a deterioration of insertion loss within the passband is also not seen. This is due to the effect that, since the duties of the IDT and the reflectors in the surface acoustic wave resonators 703 and 704 are made different, the amplitude and phase characteristics in the surface acoustic wave resonators 703 and 704 differ from each other, and the deviation of the degree of balance at higher frequencies of the passband in the longitudinally coupled resonator-type surface acoustic wave filters 101 and 102 is corrected.

Figure 23:
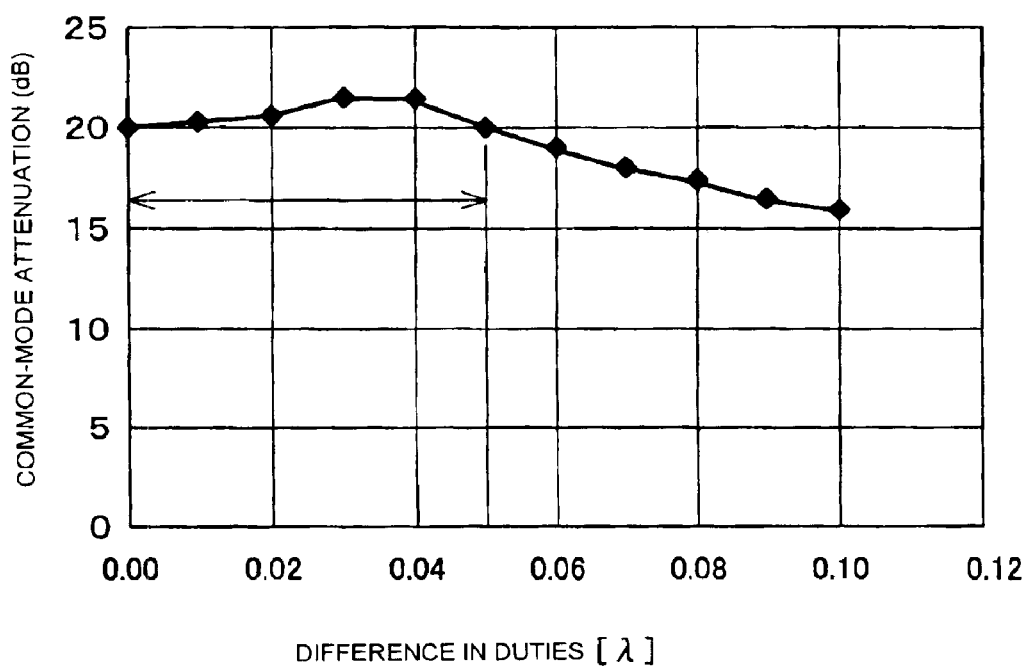
FIG. 23 is a graph in which the range in which the advantages of the surface acoustic wave device of the third preferred embodiment are obtained was checked.

Next, the range in which the common-mode attenuation is improved was studied. The study was made in such a manner that the duties (x) of the IDT 723 and the reflectors 722 and 724 in the surface acoustic wave resonator 703 and the duties (y) of the IDT 726 and the reflectors 725 and 727 in the surface acoustic wave resonator 704 were changed, and the common-mode attenuation at 1880 MHz to 1900 MHz with respect to the difference (x−y) between these duties was checked. The results are shown in FIG. 23. It can be seen from FIG. 23 that, until the difference between the duties is approximately 0.05, common-mode attenuation which is larger than that in a case where the duties of the surface acoustic wave resonators 703 and 704 are not made different is obtained. That is, in the surface acoustic wave device 700, it can be seen that, preferably, the duties are in the approximate range of $0<|x-y|\leq 0.05$.

As described in the foregoing, in the third preferred embodiment, in the surface acoustic wave device having a balanced-to-unbalanced conversion function by using two longitudinally coupled resonator-type surface acoustic wave filters in which surface acoustic wave resonators are connected in series, the surface acoustic wave resonators are correspondingly connected in series between the longitudinally coupled resonator-type surface acoustic wave filters and the balanced signal terminal, and the duties of the IDT and the reflectors in each surface acoustic wave resonator are made different. As a result, it is possible to obtain a surface acoustic wave device having a large common-mode attenuation at higher frequencies of the passband.

Figure 24:
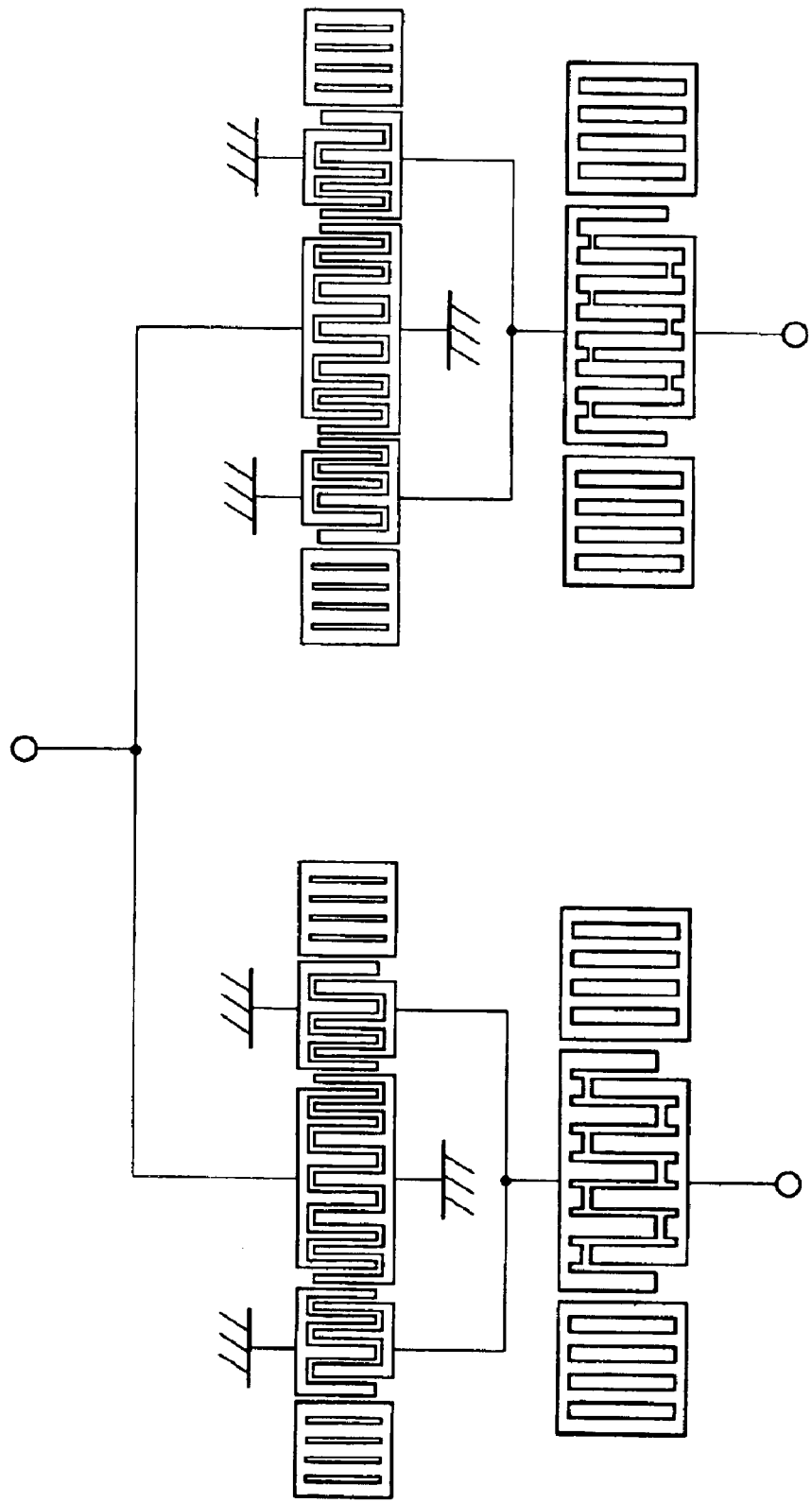
FIG. 24 is a schematic view showing a modification of the surface acoustic wave device.
Figure 25:
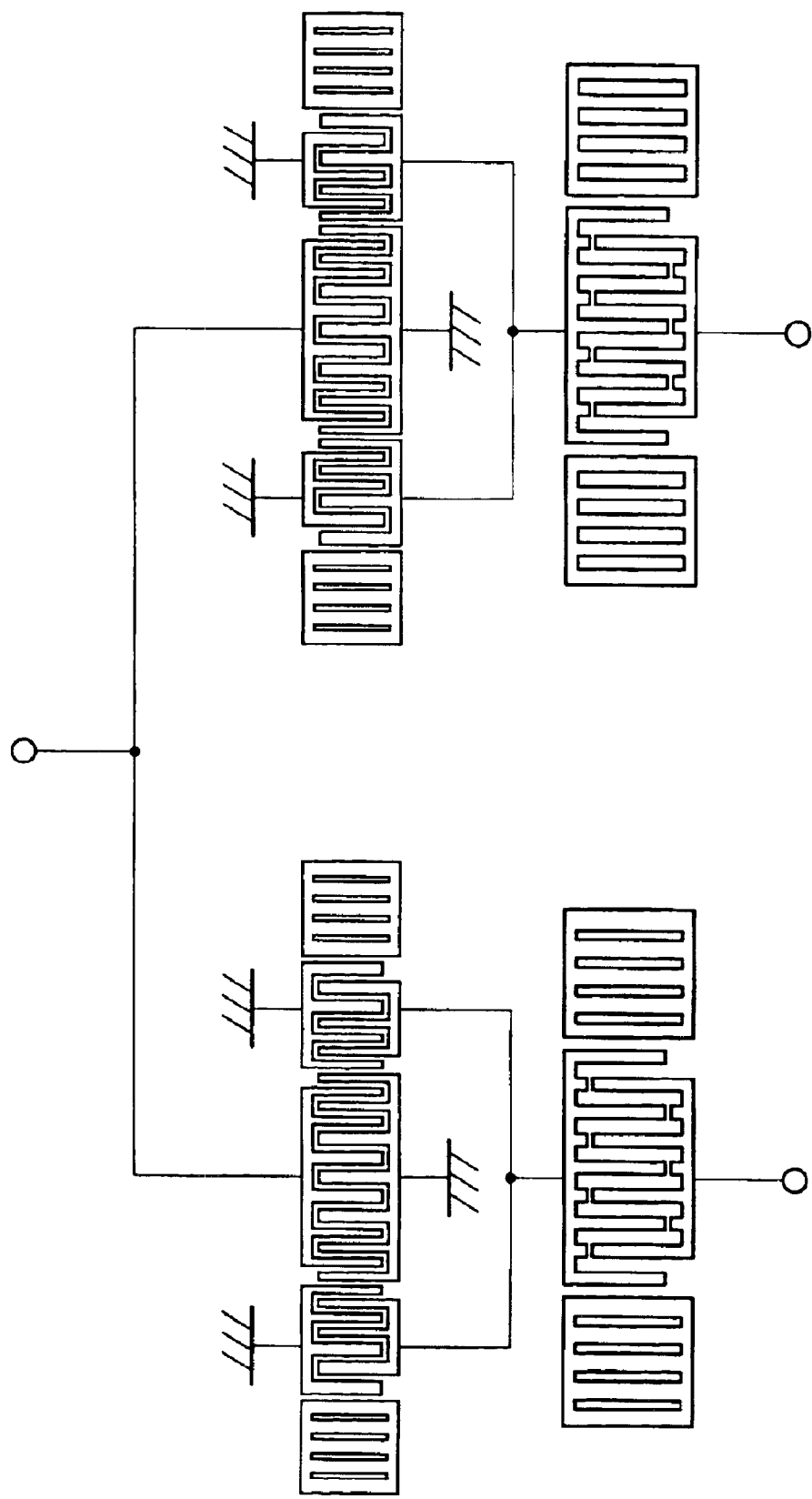
FIG. 25 is a schematic view showing another modification of the surface acoustic wave device.

In the surface acoustic wave device 700, among the duties of the IDT 723 and the reflectors 722 and 724 in the surface acoustic wave resonator 703, and the duties of the IDT 726 and the reflectors 725 and 727 in the surface acoustic wave resonator 704, the duty of only the IDT of the surface acoustic wave resonator may be different, as shown in FIG. 24, or the duty of only the reflectors of the surface acoustic wave resonator may be made different, as shown in FIG. 25. Similar advantages can be obtained in these configurations.

In the surface acoustic wave device 700 of the third preferred embodiment, although an example in which two longitudinally coupled resonator-type surface acoustic wave filters having three IDTs are used is described, the surface acoustic wave device 700 may be configured to use two longitudinally coupled resonator-type surface acoustic wave filters having five IDTs. Furthermore, a surface acoustic wave device having a balanced-to-unbalanced conversion function may be configured by using one longitudinally coupled resonator-type surface acoustic wave filter. Furthermore, a surface acoustic wave device having a balanced-to-unbalanced conversion function may be configured by using a surface acoustic wave filter in which at least one IDT is divided in the surface acoustic wave propagation direction or in the cross-width direction. In the above-described configuration, by making the duties of the IDT and the reflectors in each surface acoustic wave resonator different from each other, a surface acoustic wave device having a large common-mode attenuation at higher frequencies of the passband can be obtained.

Fourth Preferred Embodiment

Figure 26:
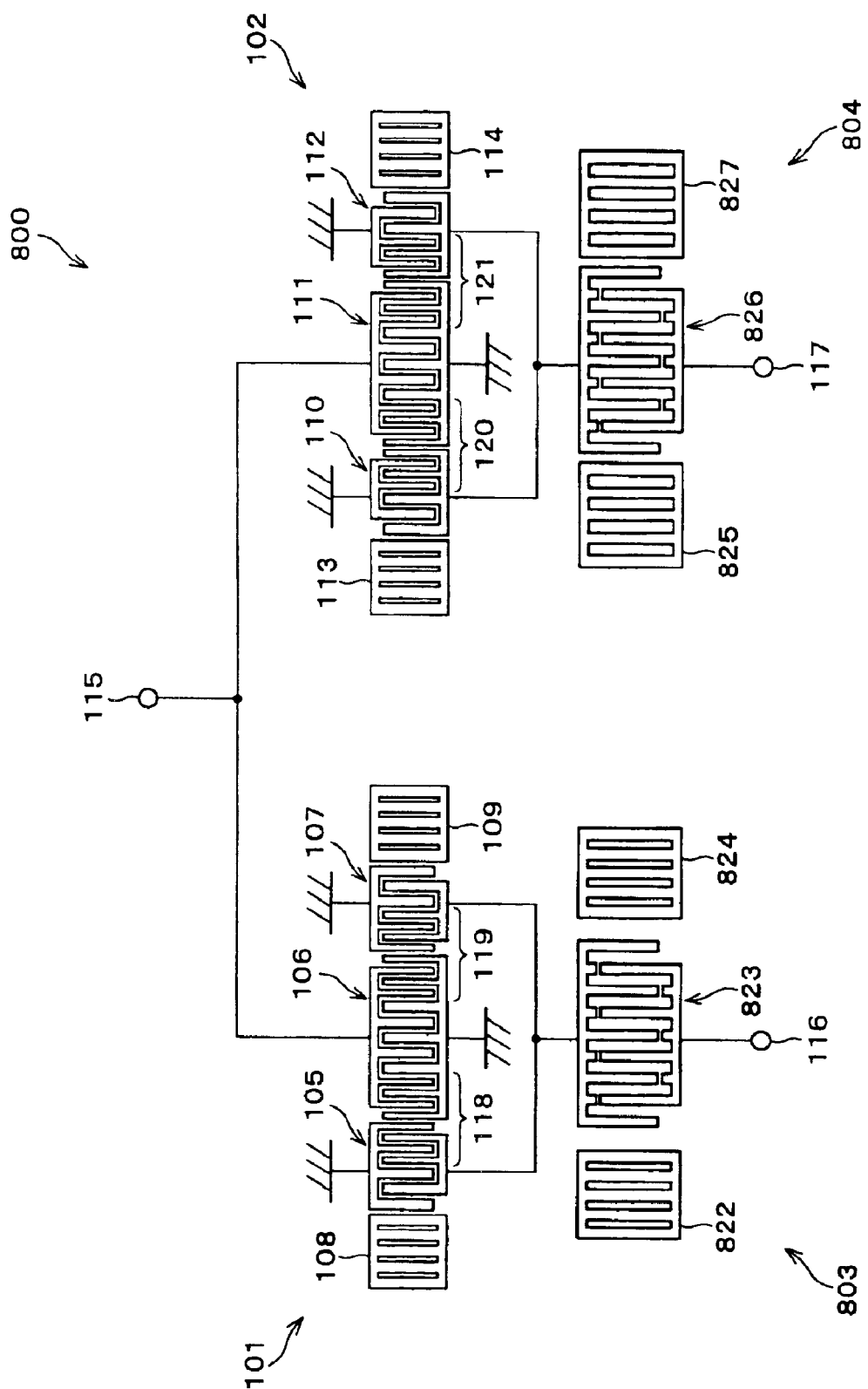
FIG. 26 is a schematic view of a surface acoustic wave device according to a fourth preferred embodiment of the present invention.

Another preferred embodiment of the present invention will now be described below with reference to FIG. 26. For the sake of convenience of description, components having the same function as that of the components shown in the first preferred embodiment are designated with the same reference numerals, and accordingly, descriptions thereof are omitted.

A surface acoustic wave device 800 according to the fourth preferred embodiment of the present invention is configured in such a manner that, when compared to the surface acoustic wave device 100 of the first preferred embodiment, instead of the surface acoustic wave resonators 103 and 104 are replaced with surface acoustic wave resonators 803 and 804. The surface acoustic wave resonators 803 and 804 are configured in such a manner that reflectors 822 and 824 are arranged so as to sandwich an IDT 823, and reflectors 825 and 827 are arranged so as to sandwich an IDT 826.

In the surface acoustic wave device 800, the center-to-center distance between mutually adjacent electrode fingers of each of the reflectors 822 and 824 and the IDT 823 in the surface acoustic wave resonator 803 differs from the center-to-center distance between mutually adjacent electrode fingers of each of the reflectors 825 and 825 and the IDT 826 in the surface acoustic wave resonator 804. That is, the center-to-center distance between the outermost electrode fingers of the IDT and the reflectors differs between the surface acoustic wave resonators 803 and 804. Furthermore, the ratio of the pitch of the IDT 823 to the pitch of the reflectors 822 and 824 in the surface acoustic wave resonator 803 differs from the ratio of the pitch of the IDT 826 to the pitch of the reflectors 825 and 827 in the surface acoustic wave resonator 804.

The above-described configuration is such that the configuration of the first preferred embodiment and the configuration of the second preferred embodiment are combined, that is, the center-to-center distance between the outermost electrode fingers of the reflectors and the IDT and the ratio of the pitch ratios of the reflectors and the IDT are made different in each surface acoustic wave resonator. Also, in this configuration, a surface acoustic wave device in which the amount of common mode attenuation at higher frequencies of the passband is large is obtained.

As described above, the configurations described in the first to third preferred embodiments can be combined. A combination of at least two features among the three following features can be selectively made: (1) the center-to-center distance between the outermost electrode fingers in the reflectors and the IDT, (2) the ratio of the pitch ratios of the reflectors and the IDT, and (3) the duties of the reflectors and the IDT in each surface acoustic wave resonator. These configurations also make it possible to obtain a surface acoustic wave device in which the amount of common-mode attenuation at higher frequencies of the passband is large.

Next, a communication device including a surface acoustic wave device according to the above-described preferred embodiments will now be described with reference to FIG. 27. A communication device 600 includes, on the receiver side (the Rx side) for performing reception, an antenna 601, an antenna duplexer section/RF Top filter 602, an amplifier 603, an Rx interstage filter 604, a mixer 605, a 1st IF filter 606, a mixer 607, a 2nd IF filter 608, a 1st+2nd local synthesizer 611, a TCXO (temperature compensated crystal oscillator) 612, a divider 613, and a local filter 614.

Figure 27:
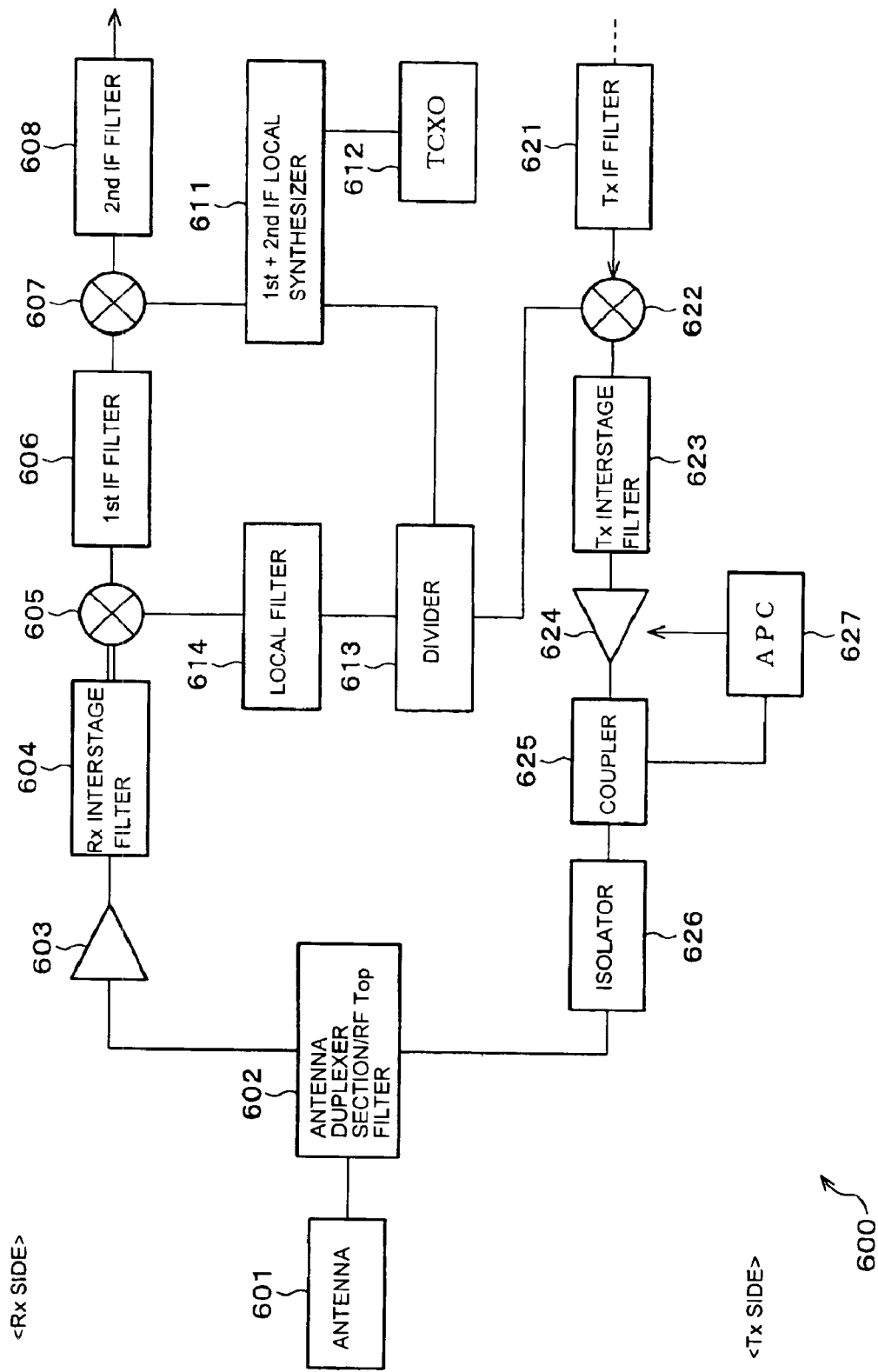
FIG. 27 is a block diagram of the essential portion of a communication device including the surface acoustic wave device of the above-described preferred embodiments of the present invention.

It is preferable that transmission be performed from the Rx interstage filter 604 to the mixer 605 by each balanced signal in order to ensure balanced characteristics, as indicated by two lines in FIG. 27.

The communication device 600 commonly includes the antenna 601 and the antenna duplexer section/RF Top filter 602, and includes, on the transceiver side (the Tx side) for performing transmission, a Tx IF filter 621, a mixer 622, a Tx interstage filter 623, an amplifier 624, a coupler 625, an isolator 626, and an APC (automatic power control) 627.

The surface acoustic wave device described in the above-described preferred embodiments can be suitably used in the Rx interstage filter 604, the 1st IF filter 606, the Tx IF filter 621, the Tx interstage filter 623, and the antenna duplexer section/RF Top filter 602.

The surface acoustic wave device according to various preferred embodiments of the present invention can have a filter function and an unbalanced-to-balanced conversion function, and moreover, has superior attenuation characteristics in the vicinity of outside the passband, and superior characteristics such that, in particular, the amount of attenuation at lower frequencies of the passband is large and the amount of common mode attenuation is large. Therefore, the communication device of a preferred embodiment of the present invention, having the above-described surface acoustic wave device according to the other preferred embodiments of the present invention, greatly improves transmission characteristics.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A surface acoustic wave device comprising:
   at least one surface acoustic wave filter having at least two interdigital transducers arranged along a surface acoustic wave propagation direction, the at least one surface acoustic wave filter being arranged on a piezoelectric substrate so as to have a balanced-to-unbalanced conversion function and two balanced signal terminals being connected to the surface acoustic wave filter; and
   surface acoustic wave resonators including interdigital transducer sandwiched between reflectors are correspondingly connected in series to said two balanced signal terminals; wherein
   a center-to-center distance between mutually adjacent electrode fingers in the reflector and the interdigital transducers in one of the surface acoustic wave resonators differs from that of the other surface acoustic wave resonator.

2. A surface acoustic wave device according to claim 1, wherein, when the wavelength determined by the structure of the interdigital transducer of said surface acoustic wave filter is denoted as λ, and when the center-to-center distances between mutually adjacent electrode fingers in the reflector and the interdigital transducer in said two surface acoustic wave resonators are correspondingly denoted as Xλ and Yλ, the following relationship is satisfied:

$$(0+0.5n)\lambda < |X-Y|\lambda \leq (0.18+0.5n)\lambda$$

where n=0, 1, 2 . . .

3. A surface acoustic wave device according to claim 1, wherein two longitudinally coupled resonator-type surface acoustic wave filters having three interdigital transducers are provided.

4. A surface acoustic wave device according to claim 1, wherein two longitudinally coupled resonator-type surface acoustic wave filters having five interdigital transducers are provided.

5. A surface acoustic wave device according to claim 1, wherein the at least one surface acoustic wave filter is a longitudinally coupled resonator-type surface acoustic wave filter having three interdigital transducers.

6. A surface acoustic wave device according to claim 1, wherein the at least one surface acoustic wave filter is a longitudinally coupled resonator-type surface acoustic wave filter having five interdigital transducers.

7. A surface acoustic wave day according to claim 6, wherein at least one of the interdigital transducers of said longitudinally coupled resonator-type surface acoustic wave filter is divided in a surface acoustic wave propagation direction.

8. A surface acoustic wave device according to claim 8, wherein at least one of the interdigital transducers of said longitudinally coupled resonator-type surface acoustic wave filter is divided in a surface acoustic wave cross-width direction.

9. A surface acoustic wave device according to claim 1, further comprising a package, wherein said piezoelectric substrate is face-down mounted in the package.

10. A communication device comprising the surface acoustic wave device according to claim 1.

11. A surface acoustic wave device comprising:
at least one surface acoustic wave filter having at least two interdigital transducers arranged along a surface acoustic wave propagation direction, the at least one surface acoustic wave filter being arranged on a piezoelectric substrate so as to have a balanced-to-unbalanced conversion function and two balanced signal terminals being connected to the surface acoustic wave filter; and
surface acoustic wave resonators including an interdigital transducer sandwiched between reflectors are correspondingly connected in series to said two balanced signal terminals; wherein
a pitch ratio of a pitch of the reflectors to a pitch of the interdigital transducer in one of the surface acoustic wave resonators is different from a pitch ratio of a pitch of the reflectors to a pitch of the interdigital transducer in the other surface acoustic wave resonator.

12. A surface acoustic wave device according to claim 11, wherein, when the ratio of the pitch of the reflectors to the pitch of the interdigital transducer in said two surface acoustic wave resonators are correspondingly denoted as a and b, the following relationship is satisfied:

$$0.984 \leq a/b < 1.$$

13. A surface acoustic wave device according to claim 11, wherein two longitudinally coupled resonator-type surface acoustic wave filters having three interdigital transducers are provided.

14. A surface acoustic wave device according to claim 11, wherein two longitudinally coupled resonator-type surface acoustic wave filters having five interdigital transducers are provided.

15. A surface acoustic wave device according to claim 11, wherein the at least one surface acoustic wave filter is a longitudinally coupled resonator-type surface acoustic wave filter having three interdigital transducers.

16. A surface acoustic wave device according to claim 11, wherein the at least one surface acoustic wave filter is a longitudinally coupled resonator-type surface acoustic wave filter having five interdigital transducers.

17. A surface acoustic wave device according to claim 16, wherein at least one of the interdigital transducers of said longitudinally coupled resonator-type surface acoustic wave filter is divided in a surface acoustic wave propagation direction.

18. A surface acoustic wave device according to claim 16, wherein at least one of the interdigital transducers of said longitudinally coupled resonator-type surface acoustic wave filter is divided in a surface acoustic wave cross-width direction.

19. A surface acoustic wave device according to claim 11, further comprising a package, wherein said piezoelectric substrate is face-down mounted in the package.

20. A communication device comprising the surface acoustic wave device according to claim 11.

21. A surface acoustic wave device comprising:
at least one surface acoustic wave filter having at least two interdigital transducers arranged along a surface acoustic wave propagation direction, the at least one surface acoustic wave filter being arranged on a piezoelectric substrate so as to have a balanced-to-unbalanced conversion function and two balanced signal terminals being connected to the surface acoustic wave filter; and
surface acoustic wave resonators including an interdigital transducer sandwiched between reflectors are correspondingly connected in series to said two balanced signal terminals; wherein
a duty in at least one of the interdigital transducer and the reflector in one of the surface acoustic wave resonators differs from that of the other surface acoustic wave resonator.

22. A surface acoustic wave device according to claim 21, wherein, when the duties in the at least one of the interdigital transducer and the reflector in said two surface acoustic wave resonators are correspondingly denoted as x and y, the following relationship is satisfied:

$$0 < |x-y| \leq 0.05.$$

23. A surface acoustic wave device according to claim 21, wherein two longitudinally coupled resonator-type surface acoustic wave filters having three interdigital transducers are provided.

24. A surface acoustic wave device according to claim 21, wherein two longitudinally coupled resonator-type surface acoustic wave filters having five interdigital transducers are provided.

25. A surface acoustic wave device according to claim 21, wherein the at least one surface acoustic wave filter is a longitudinally coupled resonator-type surface acoustic wave filter having three interdigital transducers.

26. A surface acoustic wave device according to claim 21, wherein the at least one surface acoustic wave filter is a longitudinally coupled resonator-type surface acoustic wave filter having five interdigital transducers.

27. A surface acoustic wave device according to claim 26, wherein at least one of the interdigital transducers of said longitudinally coupled resonator-type surface acoustic wave filter is divided in a surface acoustic wave propagation direction.

28. A surface acoustic wave devise according to claim 26, wherein at least one of the interdigital transducers of said longitudinally coupled resonator-type surface acoustic wave filter is divided in a surface acoustic wave cross-width direction.

29. A surface acoustic wave device according to claim 21, further comprising a package, wherein said piezoelectric substrate is face-down mounted in the package.

30. A communication device comprising the surface acoustic wave device according to claim 21.

31. A surface acoustic wave device comprising:
at least one surface acoustic wave filter having at least two interdigital transducers arranged along a surface acoustic wave propagation direction, the at least one surface acoustic wave filter being arranged on a piezoelectric substrate so as to have a balanced-to-unbalanced conversion function and two balanced signal terminals being connected to the surface acoustic wave filter; and
surface acoustic wave resonators including an interdigital transducer sandwiched between reflectors are correspondingly connected in series to said two balanced signal terminals; wherein
at least two of a center-to-center distance between mutually adjacent electrode fingers in the reflector and the interdigital transducer, a pitch ratio in the reflector and the interdigital transducer, and a duty in at least one of the interdigital transducer and the reflector in one of the surface acoustic wave resonators differ from those of the other surface acoustic wave resonator.

32. A surface acoustic wave device according to claim 31, wherein two longitudinally coupled resonator-type surface acoustic wave filters having three interdigital transducers are provided.

33. A surface acoustic wave device according to claim 31, wherein two longitudinally coupled resonator-type surface acoustic wave filters having five interdigital transducers are provided.

34. A surface acoustic wave device according to claim 31, wherein the at least one surface acoustic wave filter is a longitudinally coupled resonator-type surface acoustic wave filter having three interdigital transducers.

35. A surface acoustic wave device according to claim 31, wherein the at least one surface acoustic wave filter is a longitudinally coupled resonator-type surface acoustic wave filter having five interdigital transducers.

36. A surface acoustic wave device according to claim 35, wherein at least one of the interdigital transducers of said longitudinally coupled resonator-type surface acoustic wave filter is divided in a surface acoustic wave propagation direction.

37. A surface acoustic wave device according to claim 35, wherein at least one of the interdigital transducers of said longitudinally coupled resonator-type surface acoustic wave filter is divided in a surface acoustic wave cross-width direction.

38. A surface acoustic wave device according to claim 31, further comprising a package, wherein said piezoelectric substrate is face-down mounted in the package.

39. A communication device comprising the surface acoustic wave device according to claim 31.

* * * * *